(12) United States Patent
Hayashi et al.

(10) Patent No.: US 11,480,842 B2
(45) Date of Patent: Oct. 25, 2022

(54) SUBSTRATE AND ELECTROPHORETIC DEVICE

(71) Applicant: Japan Display Inc., Minato-ku (JP)

(72) Inventors: Hirotaka Hayashi, Minato-ku (JP); Akihiro Ogawa, Minato-ku (JP)

(73) Assignee: Japan Display Inc., Tokyo (JP)

( * ) Notice: Subject to any disclaimer, the term of this patent is extended or adjusted under 35 U.S.C. 154(b) by 97 days.

(21) Appl. No.: 16/910,236

(22) Filed: Jun. 24, 2020

(65) Prior Publication Data

US 2020/0319522 A1 Oct. 8, 2020

Related U.S. Application Data

(63) Continuation of application No. PCT/JP2018/046890, filed on Dec. 19, 2018.

(30) Foreign Application Priority Data

Dec. 28, 2017 (JP) .............................. JP2017-254569

(51) Int. Cl.
| | |
|---|---|
| *G02F 1/1676* | (2019.01) |
| *G02F 1/1343* | (2006.01) |
| *G02F 1/1362* | (2006.01) |
| *G02F 1/167* | (2019.01) |
| *H01L 27/12* | (2006.01) |

(52) U.S. Cl.
CPC ........ *G02F 1/1676* (2019.01); *G02F 1/13439* (2013.01); *G02F 1/136286* (2013.01); *G02F 1/167* (2013.01); *H01L 27/124* (2013.01); *G02F 2201/121* (2013.01); *G02F 2201/123* (2013.01)

(58) Field of Classification Search
CPC .............. G02F 1/1676; G02F 1/13439; G02F 1/136286

See application file for complete search history.

(56) References Cited

U.S. PATENT DOCUMENTS

| | | | |
|---|---|---|---|
| 2009/0027579 A1* | 1/2009 | Aota | ................. G02F 1/136227 349/41 |
| 2013/0148048 A1 | 6/2013 | Hiratsuka et al. | |
| 2013/0314636 A1* | 11/2013 | Chen | ..................... H01L 27/124 349/43 |
| 2017/0192593 A1 | 7/2017 | Cho et al. | |

FOREIGN PATENT DOCUMENTS

| | | |
|---|---|---|
| JP | 63-172298 A | 7/1988 |
| JP | 2011-221097 A | 11/2011 |
| JP | 2013-125068 A | 6/2013 |
| JP | 2017-120418 A | 7/2017 |

OTHER PUBLICATIONS

Notice of Reasons for Refusal dated Jul. 6, 2021 in Japanese Patent Application No. 2019-561592 (with English language translation), 5 pages.

International Search Report dated Mar. 5, 2019 in PCT/JP2018/046890 filed on Dec. 19, 2018 (with English Translation), 5 pages.

\* cited by examiner

*Primary Examiner* — Lucy P Chien

(74) *Attorney, Agent, or Firm* — Maier & Maier, PLLC

(57) ABSTRACT

According to an aspect, a substrate includes an insulating base material, a pixel electrode provided on one surface side of the base material, a common electrode provided between the base material and the pixel electrode. All sides on an outer periphery of the common electrode are located inside the pixel electrode in a plan view.

13 Claims, 33 Drawing Sheets

SUBSTRATE AND ELECTROPHORETIC DEVICE

CROSS-REFERENCE TO RELATED APPLICATION

This application claims the benefit of priority from Japanese Patent Application No. 2017-254569 filed on Dec. 28, 2017 and International Patent Application No. PCT/2018/046890 filed on Dec. 19, 2018, the entire contents of which are incorporated herein by reference.

BACKGROUND

1. Technical Field

The present invention relates to a substrate and an electrophoretic device.

2. Description of the Related Art

Recent years have seen a growing demand for display devices for use in, for example, mobile electronic apparatuses, such as mobile phones and electronic paper. For example, an electrophoretic display (EPD) used in the electronic paper has a memory property to maintain a potential when rewriting an image. Once the EPD has performed the rewriting for each frame, the potential at the time of the rewriting is maintained until the EPD performs the rewriting for the next frame. As a result, the EPD can perform low power consumption driving. Japanese Patent Application Laid-open No. 2011-221097 (JP-A-2011-221097), for example, discloses a structure of the EPD in which a first storage capacitor overlaps with a pixel switching element.

The EPD is desired to be improved in display performance.

SUMMARY

For the foregoing reasons, there is a need for a substrate and an electrophoretic device capable of improving the display performance.

According to an aspect, a substrate includes an insulating base material, a pixel electrode provided on one surface side of the base material, a common electrode provided between the base material and the pixel electrode. All sides on an outer periphery of the common electrode are located inside the pixel electrode in a plan view.

According to another aspect, an electrophoretic device includes a substrate and an electrophoretic layer disposed so as to face the substrate. The substrate includes an insulating base material, a pixel electrode provided on a surface of the base material facing the electrophoretic layer, and a common electrode provided between the base material and the pixel electrode. All sides on an outer periphery of the common electrode are located inside the pixel electrode in a plan view.

DETAILED DESCRIPTION

Figure 1:
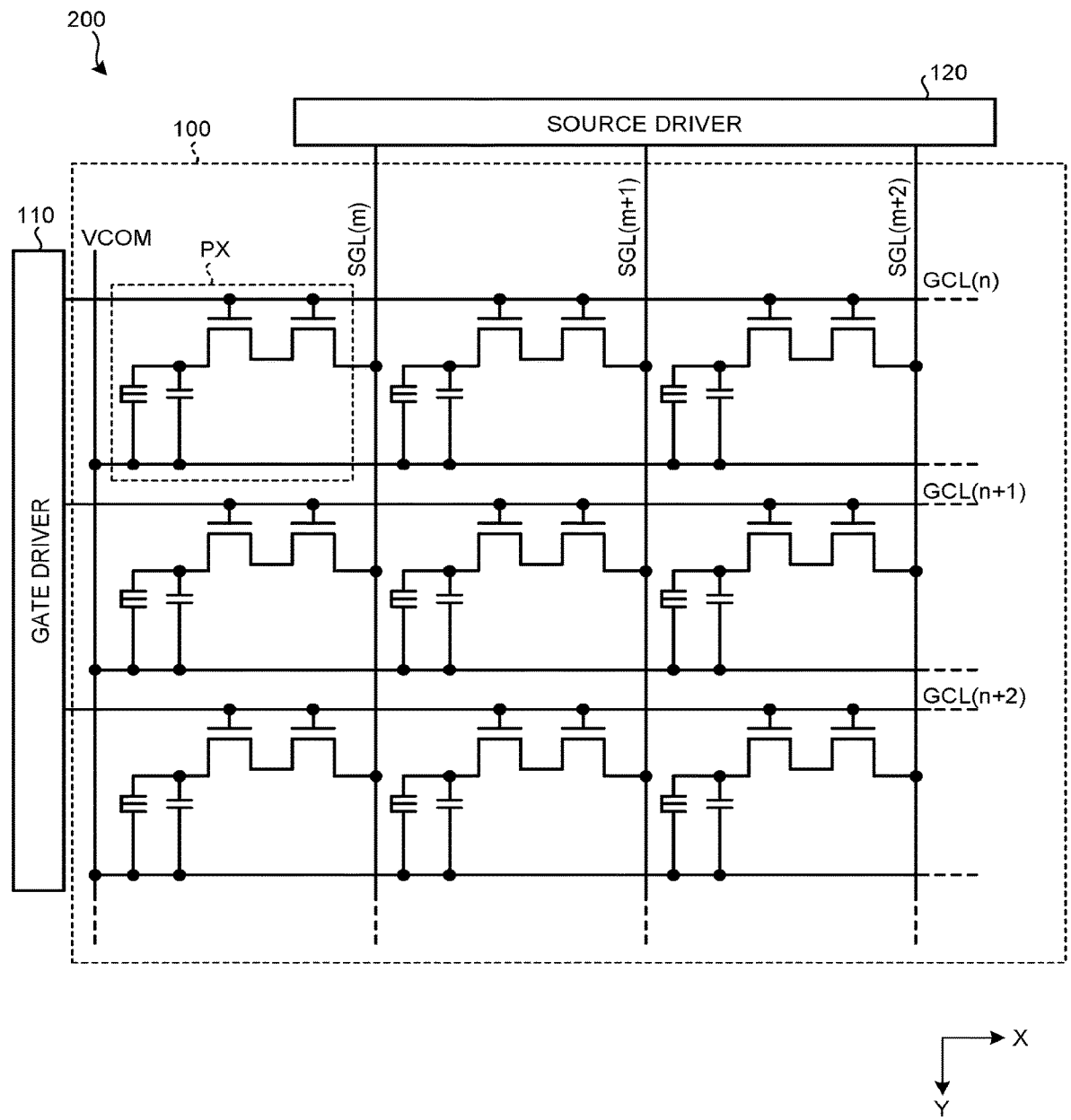
FIG. 1 is a block diagram illustrating a configuration example of a display device according to a first embodiment of the present invention.

The following describes modes (embodiments) for carrying out the present invention in detail with reference to the drawings. The present invention is not limited to the description of the embodiments to be given below. Components to be described below include those easily conceivable by those skilled in the art or those substantially identical thereto. Furthermore, the components to be described below can be combined as appropriate. The disclosure is merely an example, and the present invention naturally encompasses appropriate modifications easily conceivable by those skilled in the art while maintaining the gist of the invention. To further clarify the description, widths, thicknesses, shapes, and the like of various parts may be schematically illustrated in the drawings as compared with actual aspects thereof. However, they are merely examples, and interpretation of the present invention is not limited thereto. The same component as that described with reference to an already mentioned drawing is denoted by the same reference numeral through the description and the drawings, and detailed description thereof may not be repeated where appropriate. Herein, the X-direction denotes the right-left direction in FIG. 3; the Y-direction denotes the up-down direction in FIG. 3; and the Z-direction denotes a direction orthogonal to an XY-plane. The X-direction and the Y-direction are each also called a horizontal direction. In this disclosure, when an element A is described as being "on" another element B, the element A can be directly on the other element B, or there can be one or more elements between the element A and the other element B.

First Embodiment

Figure 2:
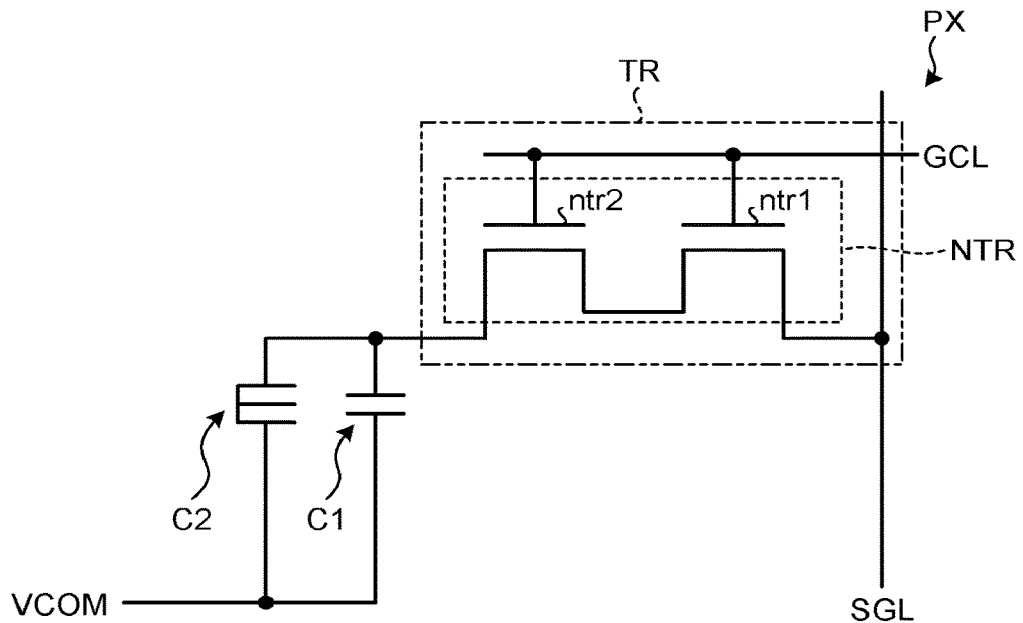
FIG. 2 is a circuit diagram illustrating a configuration example of one pixel in a thin-film transistor (TFT) substrate according to the first embodiment.

FIG. 1 is a block diagram illustrating a configuration example of a display device according to a first embodiment of the present invention. FIG. 2 is a circuit diagram illustrating a configuration example of one pixel in a TFT substrate according to the first embodiment. A display device 200 according to the first embodiment is mounted on, for example, an electronic apparatus, which is not illustrated. A power supply voltage is applied from a power supply circuit of the electronic apparatus to the display device 200, which performs image display based on a signal output from a control circuit serving as a host processor of the electronic apparatus. The display device 200 is, for example, an electrophoretic display (EPD) having an electrophoretic layer 160 (refer to FIG. 15 to be described later). As illustrated in FIG. 1, the display device 200 includes a TFT substrate 100, a gate driver 110 coupled to the TFT substrate 100, and a source driver 120 coupled to the TFT substrate 100. The electrophoretic display (EPD) is also called an electrophoretic device.

As illustrated in FIG. 1, the TFT substrate 100 includes a plurality of pixels PX, a plurality of gate lines GCL(n), GCL(n+1), GCL(n+2), . . . , and a plurality of signal lines SGL(m), SGL(m+1), SGL(m+2), . . . . The symbols n and m each denote an integer equal to or larger than 1. In the following description, the gate lines GCL(n), GCL(n+1), GCL(n+2), . . . will each be called a gate line GCL when they need not be distinguished from one another, and the signal lines SGL(m), SGL(m+1), SGL(m+2), . . . will each be called a signal line SGL when they need not be distinguished from one another.

The pixels PX are arranged in the X-direction and the Y-direction intersecting the X-direction, and are arranged in a two-dimensional matrix having a row-column configuration. The gate lines GCL extend in the X-direction, and are arranged in the Y-direction. The signal lines SGL extend in the Y-direction, and are arranged in the X-direction. With this arrangement, each of the signal lines SGL orthogonally intersects the gate lines GCL in a plan view. The plan view refers to a view from a direction normal to one surface 1a of a base material 1 of the TFT substrate 100 (refer to FIG. 10 to be described later). The one surface 1a of the base material 1 is parallel to the horizontal direction. Each of the gate lines GCL is coupled to the gate driver 110. Each of the signal lines SGL is coupled to the source driver 120.

The gate driver 110 generates a gate drive signal based on the signal output from the above-described control circuit. The gate driver 110 supplies the gate drive signal to the gate lines GCL. The source driver 120 generates a source drive signal based on the signal output from the above-described control circuit. The source driver 120 supplies the source drive signal to the signal lines SGL.

Figure 15:
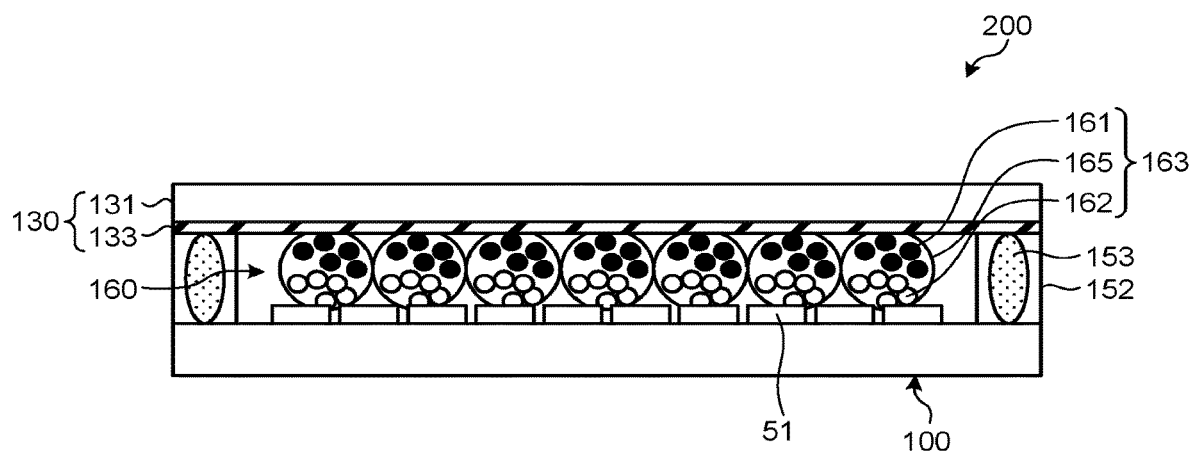
FIG. 15 is a sectional view illustrating a configuration example of the display device according to the first embodiment.

The gate driver 110 and the source driver 120 may be provided as built-in circuits directly formed on the TFT substrate 100, or may be provided on a counter substrate 130 (refer to FIG. 15 to be described later). The gate driver 110 and the source driver 120 may also be mounted in an integrated circuit (IC) mounted on another circuit substrate (such as a flexible substrate) coupled to the TFT substrate 100.

As illustrated in FIG. 2, each of the pixels PX of the TFT substrate 100 includes a pixel transistor TR. The pixel transistor TR is, for example, a bottom-gate n-channel metal-oxide semiconductor (NMOS) transistor NTR. The NMOS transistor TR includes a first NMOS transistor ntr1 and a second NMOS transistor ntr2. The first NMOS transistor ntr1 is coupled in series to the second NMOS transistor ntr2.

The gates of the NMOS transistor NTR includes a gate n1g (refer to FIG. 10 to be described later) of the first NMOS transistor ntr1 and a gate n2g (refer to FIG. 10 to be described later) of the second NMOS transistor ntr2. The gates of the NMOS transistor NTR are coupled to the gate line GCL. The source of the NMOS transistor NTR is coupled to the signal line SGL. The drain of the NMOS transistor NTR is coupled to a pixel electrode 51 (refer to FIG. 3 to be described later). The source of the NMOS transistor NTR is supplied with the source drive signal (video signal) from the signal line SGL. The gates of the NMOS transistor NTR are supplied with the gate drive signal from the gate line GCL. When the voltage of the gate drive signal supplied to the NMOS transistor NTR has reached a predetermined value or higher, the NMOS transistor NTR is turned on. As a result, the source drive signal (video signal) is supplied from the signal line SGL to the pixel electrode 51 through the NMOS transistor NTR.

Each of the pixels PX of the TFT substrate 100 has first holding capacitance C1 and second holding capacitance C2. The first holding capacitance C1 is formed between the pixel electrode 51 and a common electrode 41 (refer to FIG. 10 to be described later). The second holding capacitance C2 is formed between a counter electrode 133 of the counter substrate 130 (refer to FIG. 15 to be described later) and the pixel electrode 51. The pixel electrode 51 is supplied with the source drive signal (video signal) from the signal line SGL through the pixel transistor TR. The common electrode 41 and the counter electrode 133 are supplied with a common potential VCOM. The potential of the source drive signal (video signal) supplied to the pixel electrode 51 is held by the first holding capacitance C1 and the second holding capacitance C2.

Figure 3:
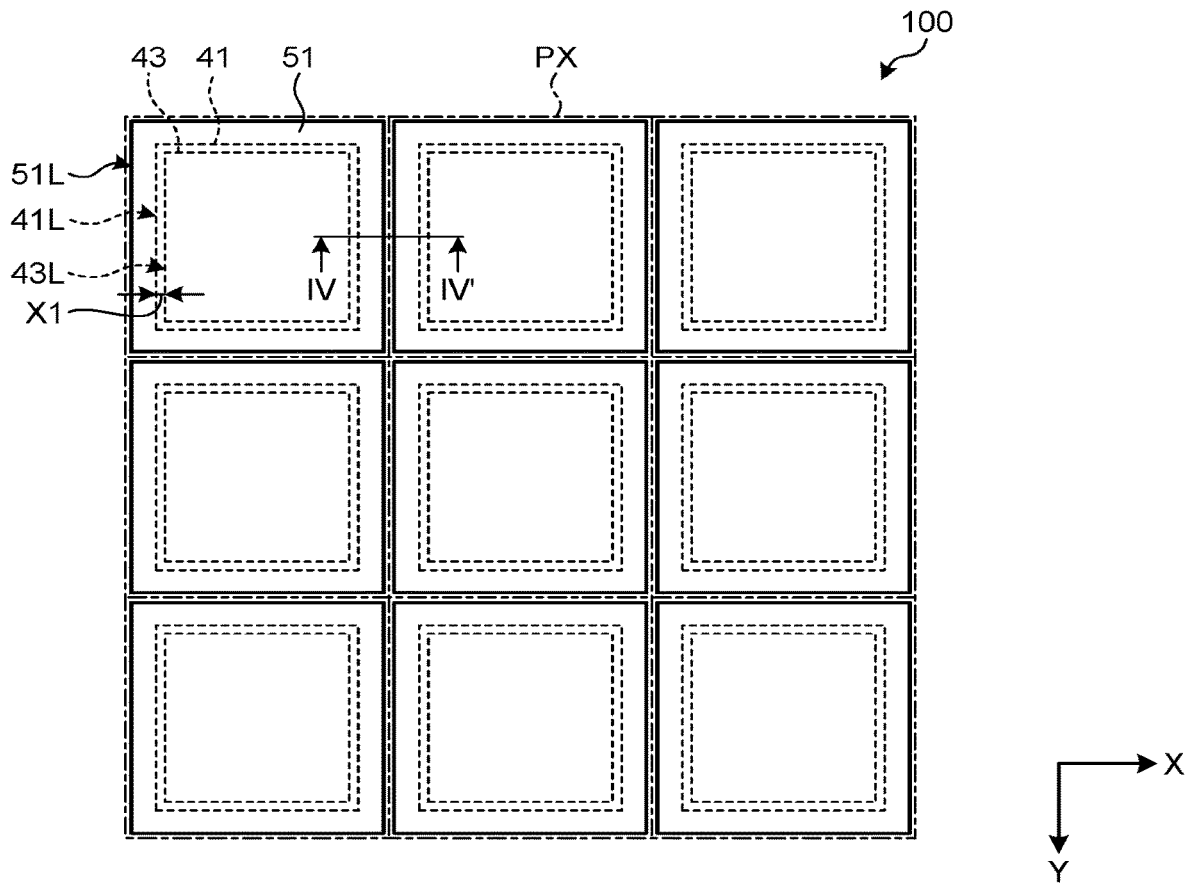
FIG. 3 is a plan view illustrating an arrangement example of the pixels in the TFT substrate according to the first embodiment.
Figure 4:
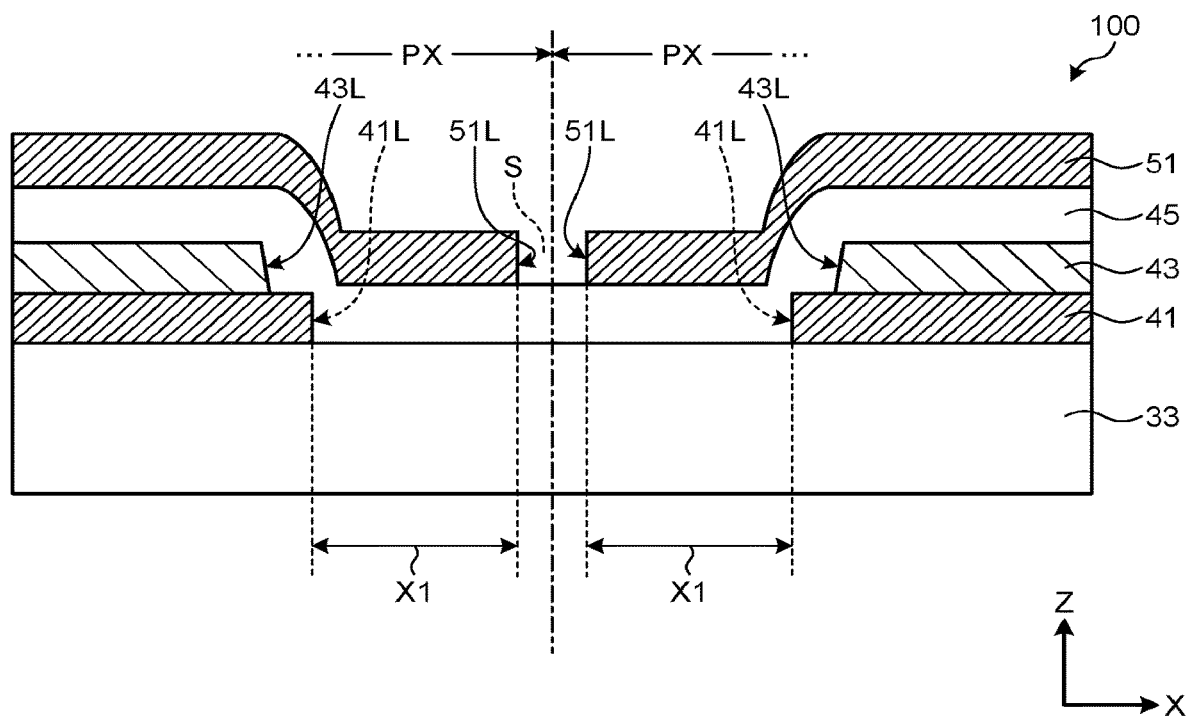
FIG. 4 is a sectional view illustrating a positional relation between a common electrode and a pixel electrode in the TFT substrate according to the first embodiment.

The following describes a structure of the TFT substrate. FIG. 3 is a plan view illustrating an arrangement example of the pixels in the TFT substrate according to the first embodiment. FIG. 4 is a sectional view illustrating a positional relation between the common electrode and the pixel electrode in the TFT substrate according to the first embodiment. The section illustrated in FIG. 4 is a section obtained by cutting the plan view illustrated in FIG. 3 along line IV-IV'. FIG. 4 omits illustration of parts located below a planarizing film 33 (i.e., on the base material 1 side).

As illustrated in FIG. 3, in the TFT substrate 100, a plurality of the pixel electrodes 51 are arranged in the X-direction and the Y-direction intersecting the X-direction, and are arranged in a two-dimensional matrix having a row-column configuration. In the embodiments (first to fifth embodiments), a region overlapping with each of the pixel electrodes 51 in the plan view serves as one of the pixels PX. The shape in the plan view of the pixel electrode 51 is, for example, a rectangle. The pixel electrode 51 has four sides 51L on the outer periphery.

Figure 9:
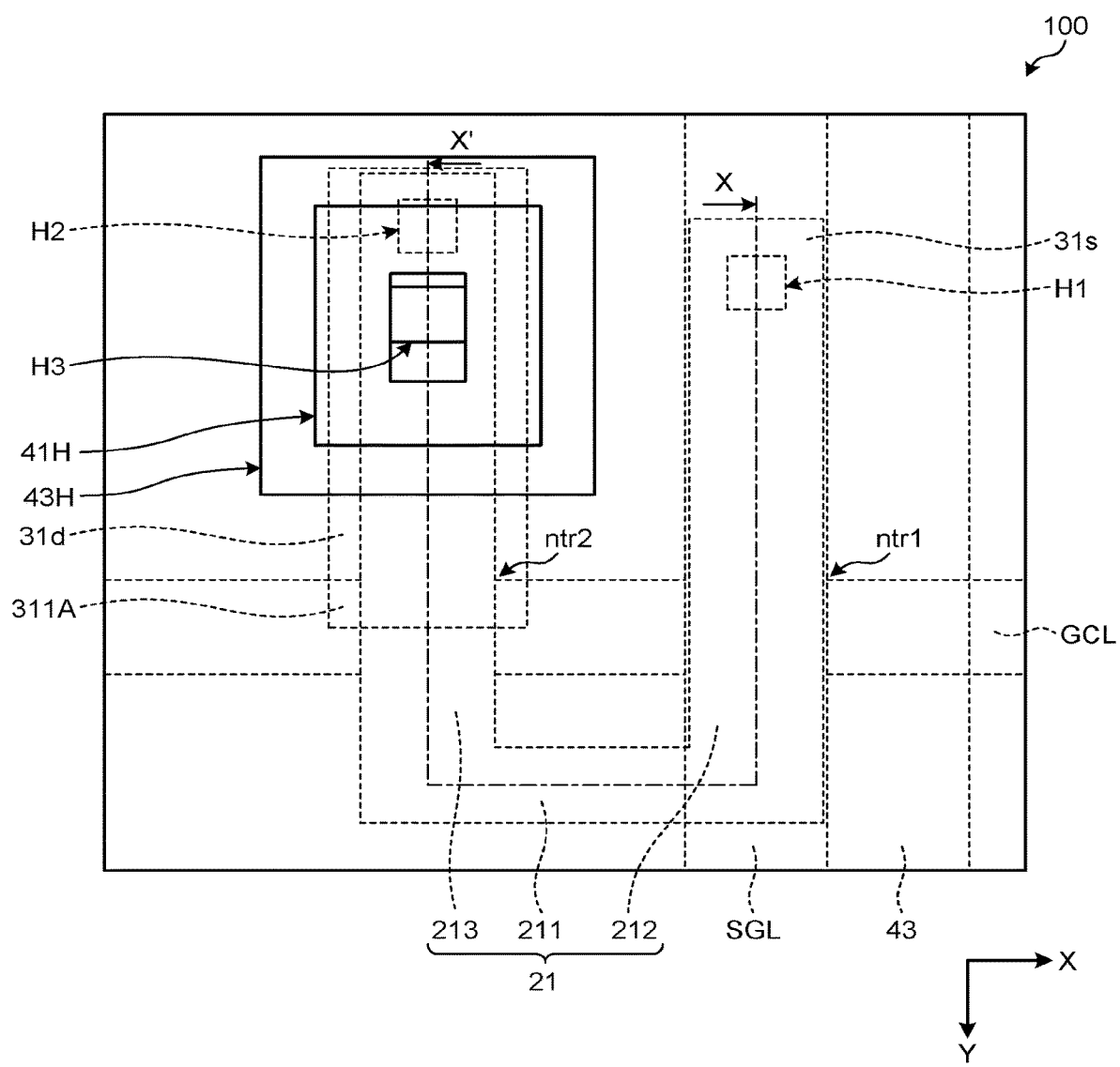
FIG. 9 is a plan view illustrating an enlarged view of a region including a pixel transistor in the TFT substrate according to the first embodiment.
Figure 10:
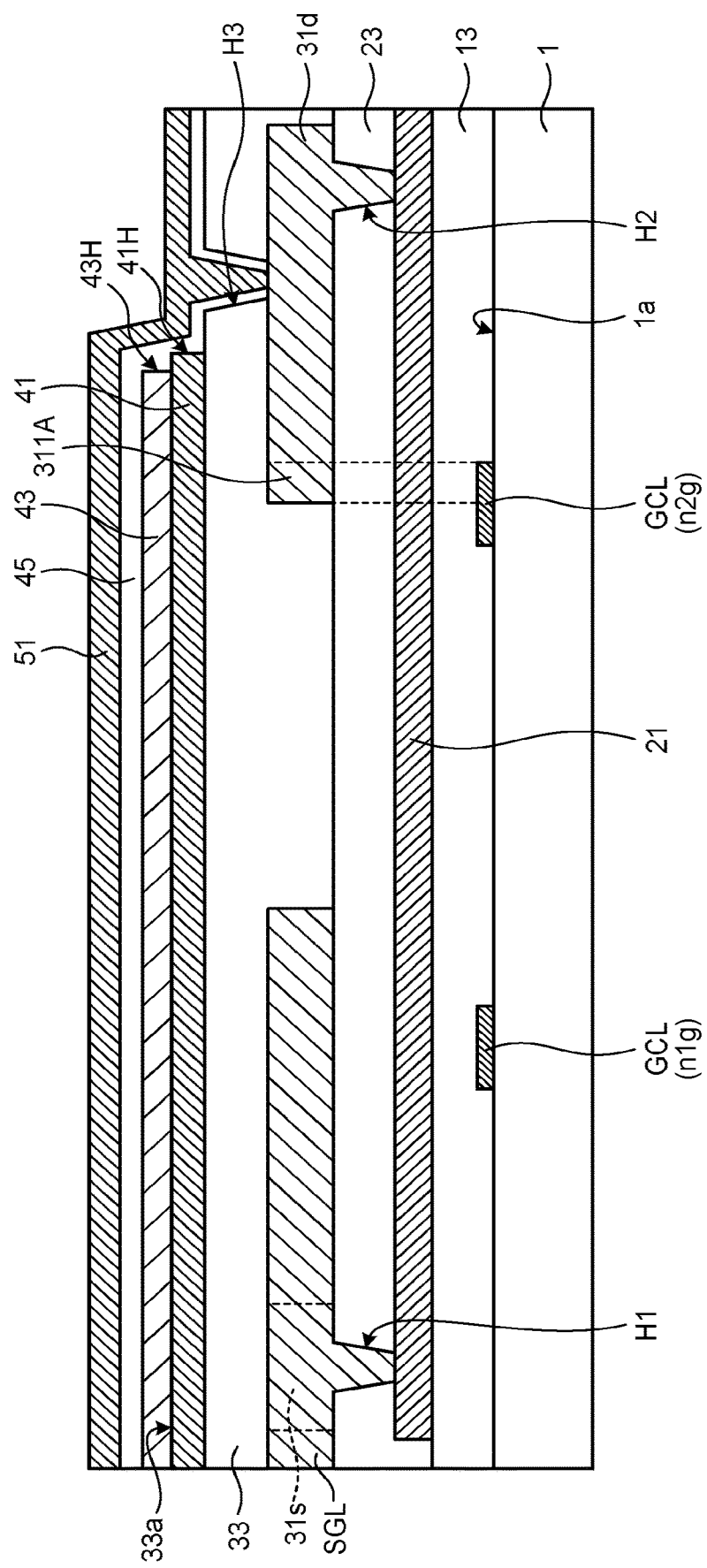
FIG. 10 is a sectional view obtained by cutting the plan view illustrated in FIG. 9 along line X-X'.

The shape in the plan view of the common electrode 41 is also, for example, a rectangle. The common electrode 41 has four sides 41L on the periphery. As illustrated in FIGS. 9 and 10 to be described later, the common electrode 41 is provided with a third contact hole H3 for coupling a drain 31d to the pixel electrode 51.

As illustrated in FIG. 4, each of the pixels PX is provided with the common electrode 41 on the planarizing film 33. A reflective film 43 is provided on the common electrode 41. An insulating film 45 is provided on the planarizing film 33. The insulating film 45 covers the common electrode 41 and the reflective film 43. The pixel electrode 51 is provided on the insulating film 45. The common electrodes 41 are arranged in the X-direction and the Y-direction intersecting the X-direction, and are arranged in a two-dimensional matrix having a row-column configuration. Adjacent ones of the common electrodes 41 are spaced from each other.

As illustrated in FIGS. 3 and 4, the common electrode 41 is located below the pixel electrode 51. The four sides 41L on the outer periphery of the common electrode 41 are all located inside the pixel electrode 51 in the plan view. Each of the pixel electrodes 51 faces a corresponding one of the common electrodes 41 on a one-to-one basis. In other words, in each of the pixels PX, each of the sides 41L of the common electrode 41 is located closer to the center of the pixel PX than a corresponding one of the sides 51L of the pixel electrode 51. For example, in each of the pixels PX, X1 denotes a horizontal distance between each of the sides 41L on the outer periphery of the common electrode 41 and one of the sides 51L on the outer periphery of the pixel electrode 51 adjacent to the side 41L. The distance X1 is 0.1 μm to 25 μm.

The reflective film 43 is located above the common electrode 41. The shape in the plan view of the reflective film 43 is also, for example, a rectangle. The reflective film 43 has four sides 43L on the outer periphery. The four sides 43L on the outer periphery of the reflective film 43 are all located inside the common electrode 41 in the plan view. In other words, in each of the pixels PX, each of the sides 43L of the reflective film 43 is located closer to the center of the pixel PX than a corresponding one of the sides 41L of the common electrode 41.

Figure 5:
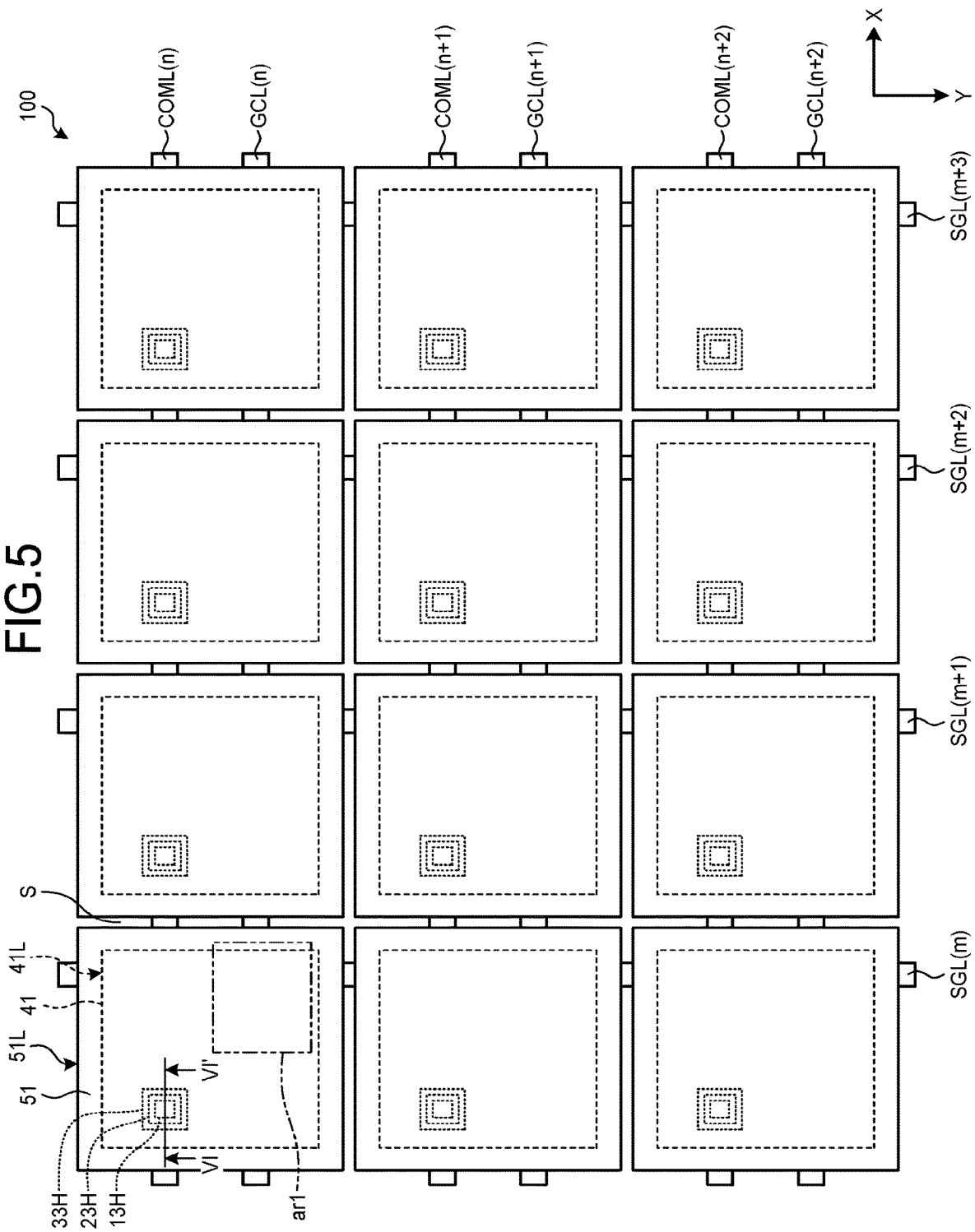
FIG. 5 is a plan view illustrating a configuration example of the TFT substrate according to the first embodiment.
Figure 6:
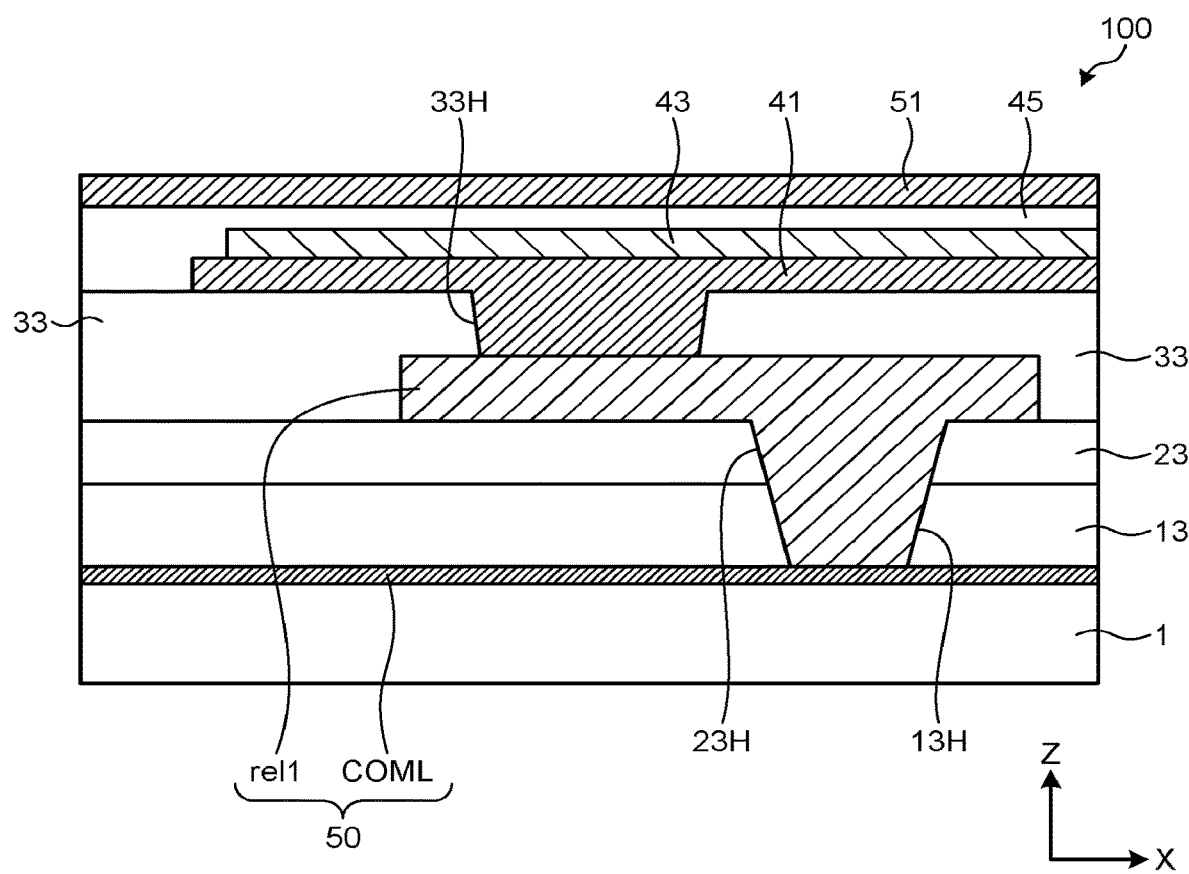
FIG. 6 is a sectional view illustrating a configuration example of a coupling portion according to the first embodiment.

FIG. 5 is a plan view illustrating a configuration example of the TFT substrate according to the first embodiment. FIG. 6 is a sectional view illustrating a configuration example of a coupling portion according to the first embodiment. The section illustrated in FIG. 6 is a section obtained by cutting the plan view illustrated in FIG. 5 along line VI-VI'. As illustrated in FIGS. 5 and 6, the TFT substrate 100 includes a coupling portion 50 that couples together the common electrodes 41. For example, the coupling portion 50 couples together the common electrodes 41 adjacent to each other in the X-direction. The coupling portion 50 includes a plurality of lines of wiring COML extending parallel to the gate line GCL, and a first relay portion rel1 that couples the wiring COML to the common electrode 41 in each of the pixels.

As described above, the pixels PX are arranged in the X-direction and the Y-direction, and are arranged in a two-dimensional matrix having a row-column configuration. The lines of the wiring COML extend in the X-direction, and are arranged in the Y-direction. The lines of the wiring COML are arranged in the Y-direction such that one of pixels PX overlaps with one line of the wiring COML in the plan view.

The lines of the wiring COML and the gate lines GCL are alternately arranged in the Y-direction. For example, the lines of the wiring COML and the gate lines GCL are arranged in the order of the line(n) of the wiring COML, the gate line GCL(n), the line(n+1) of the wiring COML, the gate line GCL(n+1), . . . in the Y-direction. With this arrangement, each of the signal lines SGL orthogonally intersects the wiring COML and the gate lines GCL in the plan view.

The wiring COML is provided in the same layer as that of the gate line GCL. The wiring COML is made of a material having the same composition as that of the gate line GCL. The wiring COML and the gate line GCL are simultaneously formed in the same process.

As illustrated in FIG. 6, the wiring COML is covered with an insulating film 13. The insulating film 13 is provided with a through-hole 13H. An interlayer insulating film 23 is provided on the insulating film 13. The interlayer insulating film 23 is provided with a through-hole 23H. The through-hole 23H is coupled to the through-hole 13H in the Z-direction. The first relay portion rel1 is provided on the interlayer insulating film 23, and buries the through-hole 23H and the through-hole 13H. The first relay portion rel1 is covered with the planarizing film 33. The planarizing film 33 is provided with a through-hole 33H. The through-hole 33H is provided at a position not arranged in line with the through-holes 23H and 13H in the Z-direction (i.e., at a position horizontally displaced from the through-holes 23H and 13H). The common electrode 41 is provided on the planarizing film 33, and buries the through-hole 33H. With this configuration, the wiring COML is electrically coupled to the common electrode 41 through the first relay portion rel1. In other words, the coupling portion 50 contacts the common electrode 41 of a light-transmitting conductive film in the third contact hole H3.

Figure 7:
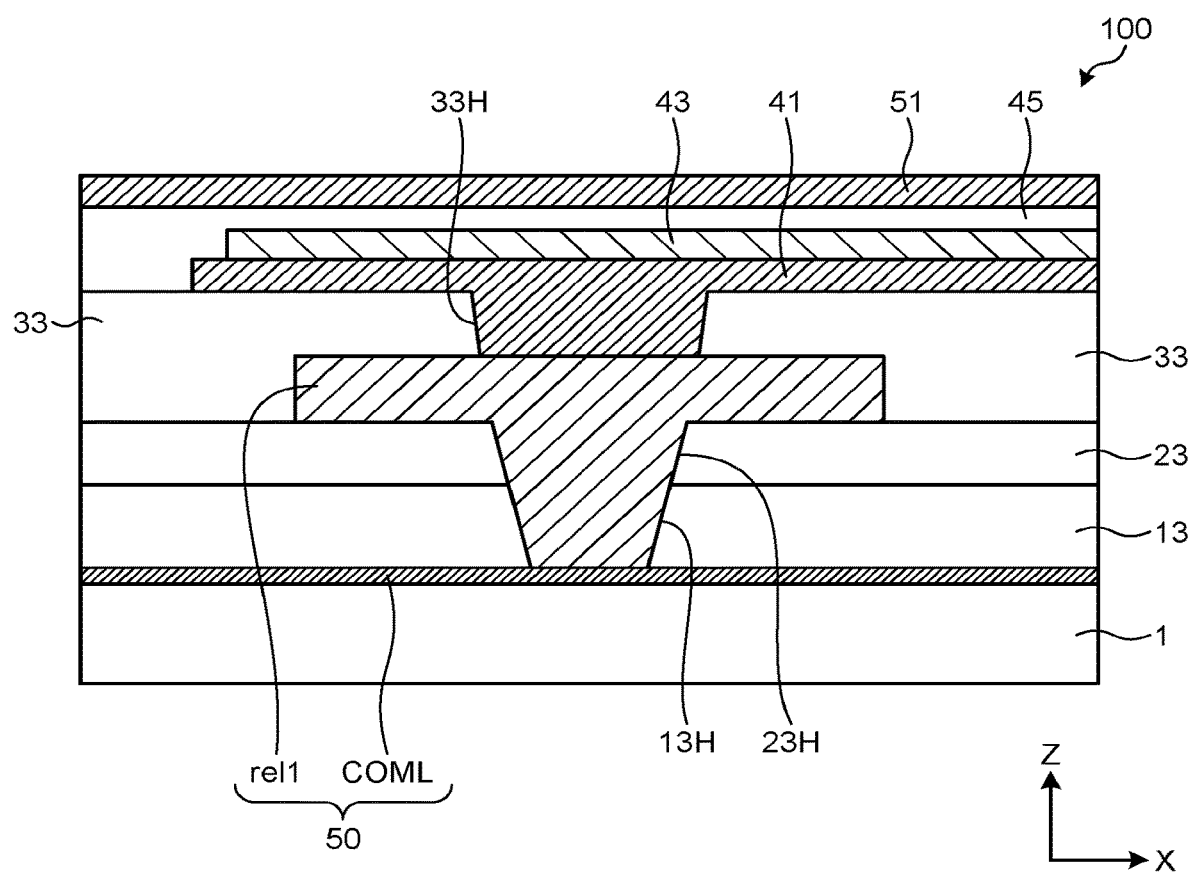
FIG. 7 is a sectional view illustrating another configuration example (No. 1) of the coupling portion according to the first embodiment.

In the present embodiment, the configuration of the coupling portion 50 is not limited to the aspect illustrated in FIG. 6. FIG. 7 is a sectional view illustrating another configuration example (No. 1) of the coupling portion according to the first embodiment. As illustrated in FIG. 7, the through-hole 33H may be provided at a position arranged in line with the through-holes 23H and 13H in the Z-direction. Also with this configuration, the wiring COML is coupled to the common electrode 41 through the first relay portion rel1.

Figure 8:
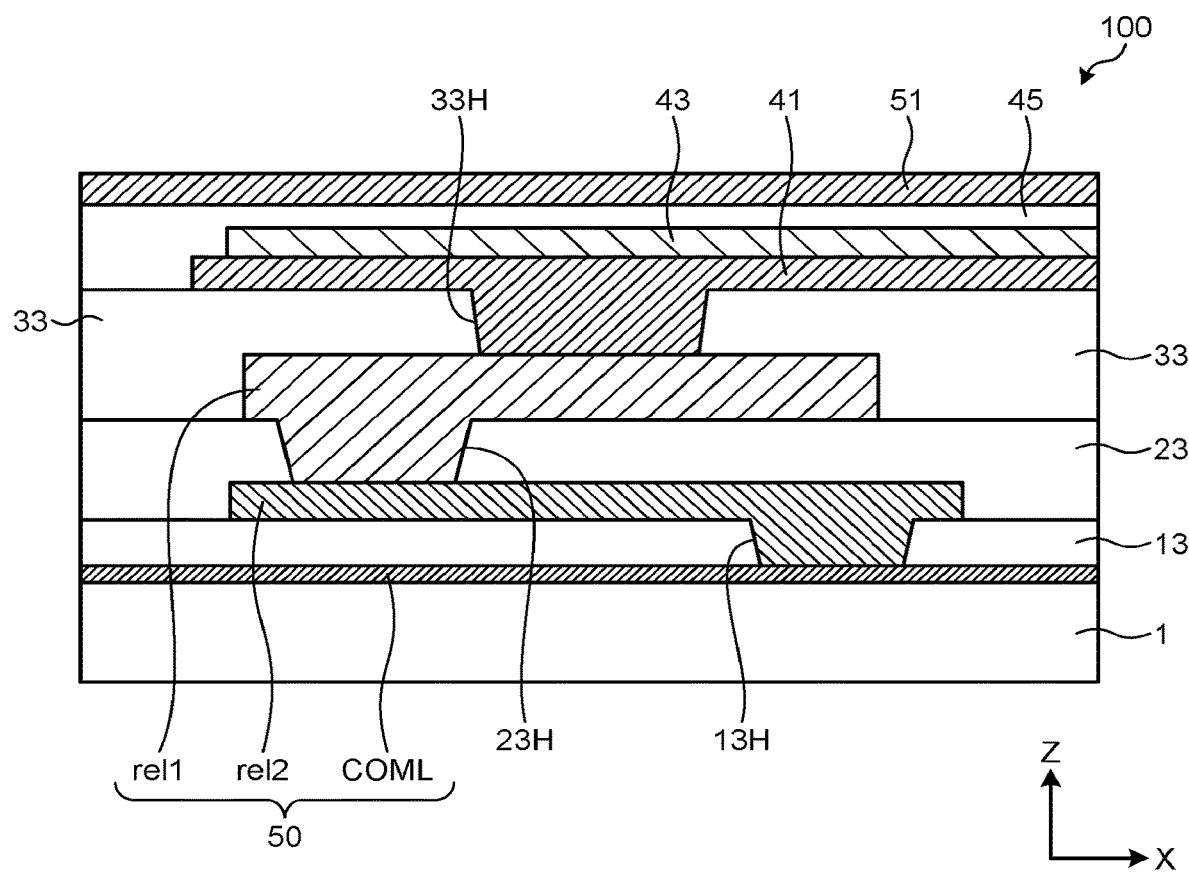
FIG. 8 is a sectional view illustrating still another configuration example (No. 2) of the coupling portion according to the first embodiment.

The coupling portion 50 may include a second relay portion rel2 in addition to the first relay portion rel1. FIG. 8 is a sectional view illustrating still another configuration example (No. 2) of the coupling portion according to the first embodiment. As illustrated in FIG. 8, the coupling portion 50 includes the wiring COML, the first relay portion rel1, and the second relay portion rel2. For example, the second relay portion rel2 is formed of an island-like semiconductor film provided between the insulating film 13 and the interlayer insulating film 23, and is interposed between the first relay portion rel1 and the wiring COML. In the coupling portion 50, the first relay portion rel1 is coupled to the second relay portion rel2 through the through-hole 23H, and the second relay portion rel2 is coupled to the wiring COML through the through-hole 13H. The through-holes 13H, 23H, and 33H are provided at positions not arranged in line with one another in the Z-direction. With this configuration, the wiring COML is coupled to the common electrode 41 through the second relay portion rel2 and the first relay portion rel1.

In the present embodiment, the through-holes 13H, 23H, and 33H may be provided in positions arranged in line in the Z-direction in FIG. 8. Also with this configuration, the wiring COML is coupled to the common electrode 41 through the second relay portion rel2 and the first relay portion rel1.

The first relay portion rel1 is provided in the same layer as that of the signal line SGL and the drain 31d (refer to FIG. 10) to be described later. The first relay portion rel1 is made of a material having the same composition as that of the signal line SGL and the drain 31d. The first relay portion rel1, the signal line SGL, and the drain 31d are simultaneously formed in the same process. The second relay portion rel2 illustrated in FIG. 8 is made of a material having the same composition as that of a semiconductor film 21 (refer to FIG. 10). The second relay portion rel2 and the semiconductor film 21 are simultaneously formed in the same process.

The wiring COML is coupled to, for example, the power supply circuit of the electronic apparatus, which is not illustrated. The wiring COML is supplied with the common potential VCOM (at, for example, 0 V) from the power supply circuit. The common potential VCOM supplied to the wiring COML is supplied through the first relay portion rel1 to the common electrode 41.

The following describes a structure of the pixel transistor TR (refer to FIG. 2) and the periphery thereof. FIG. 9 is a plan view illustrating an enlarged view of a region including the pixel transistor in the TFT substrate according to the first embodiment. A region ar1 illustrated in FIG. 5 is the region including the pixel transistor. To facilitate viewing of the structure of parts located below the pixel electrode 51 (i.e., on the base material 1 side), FIG. 9 omits illustration of the pixel electrode 51, the insulating film 45, and the planarizing film 33 illustrated in FIG. 4. FIG. 10 is a sectional view obtained by cutting the plan view illustrated in FIG. 9 along line X-X'.

As illustrated in FIGS. 9 and 10, the gate line GCL and the insulating film 13 are provided on the one surface 1a of the base material 1. The insulating film 13 covers the gate line GCL. The semiconductor film 21 and the interlayer insulating film 23 are provided on the insulating film 13. The interlayer insulating film 23 covers the semiconductor film 21. The interlayer insulating film 23 is provided with a first contact hole H1 and a second contact hole H2. The first contact hole H1 and the second contact hole H2 are through-holes with the semiconductor film 21 serving as a bottom surface thereof.

As illustrated in FIG. 9, the shape in the plan view of the semiconductor film 21 is, for example, a U-shape (or a J-shape). In other words, the semiconductor film 21 includes a linear first portion 211, a linear second portion 212, and a linear third portion 213. The second portion 212 is coupled to one end of the first portion 211, and the third portion 213 is coupled to the other end of the first portion 211. The first portion 211 and the second portion 212 form an angle of approximately 90 degrees. The first portion 211 and the third portion 213 also form an angle of approximately 90 degrees.

The gate line GCL intersects the U-shaped semiconductor film 21 in the plan view. Portions of the gate line GCL intersecting the semiconductor film 21 serve as the gates of the pixel transistor TR (refer to FIG. 2). A portion of the semiconductor film 21 intersecting the gate line GCL serves as a channel of the pixel transistor TR.

As illustrated in FIG. 2, the pixel transistor TR includes the NMOS transistor NTR. The NMOS transistor NTR includes a first NMOS transistor ntr1 and a second NMOS transistor ntr2. A portion of the gate line GCL intersecting the second portion 212 of the semiconductor film 21 serves as the gate of the first NMOS transistor ntr1. A portion of the gate line GCL intersecting the third portion 213 of the semiconductor film 21 serves as the gate of the second NMOS transistor ntr2. The semiconductor film 21 is coupled to the signal line SGL.

As illustrated in FIGS. 9 and 10, the signal line SGL and the drain 31d of the pixel transistor TR are provided on the interlayer insulating film 23. In other words, the signal line SGL and the drain 31d are provided in the same layer.

A portion of the signal line SGL burying the first contact hole H1 and the periphery thereof serve as a source 31s of the pixel transistor TR. The drain 31d is disposed at a position away from the signal line SGL, and buries the second contact hole H2. The shape in the plan view of the drain 31d is, for example, a rectangle. The signal line SGL including the source 31s and the drain 31d are made of, for example, conductive films having the same composition. In the present embodiment, the source 31s can be called a source electrode, and the drain 31d can be called a drain electrode.

The signal line SGL overlaps with a portion (for example, the gate n1g) of the gate line GCL in the plan view. A first end portion 311A of the drain 31d overlaps with a portion (for example, a drain side end of the gate n2g) of the gate line GCL in the plan view. With this configuration, when a portion of incident light (for example, light obliquely incident on the one surface 1a of the base material 1) is incident on the pixel transistor TR side, this light is blocked by the signal line SGL and the first end portion 311A of the drain 31d. Thus, since the light can be prevented from entering the gates n1g and n2g, photoelectric conversion in the pixel transistor TR is prevented. In the TFT substrate 100, a possibility of malfunction of the pixel transistor TR due to the photoelectric conversion is lowered.

As illustrated in FIG. 10, the planarizing film 33 is provided on the interlayer insulating film 23. The planarizing film 33 covers the signal line SGL. An upper surface 33a of the planarizing film 33 is flat and parallel to the one surface 1a of the base material 1. The planarizing film 33 is provided with the third contact hole H3. As illustrated in FIG. 10, the third contact hole H3 is a through-hole with the drain 31d serving as a bottom surface thereof.

The common electrode 41 is provided on the planarizing film 33. As illustrated in FIG. 10, the common electrode 41 is provided with a through-hole 41H. The through-hole 41H surrounds the third contact hole H3. The reflective film 43 is provided on the common electrode 41. The reflective film 43 is provided with one through-hole 43H. As illustrated in FIG. 9, the through-hole 43H surrounds the through-hole 41H in the plan view.

The insulating film 45 is provided on the planarizing film 33. The insulating film 45 covers the common electrode 41 and the reflective film 43. The insulating film 45 also covers an inner surface of each of the third contact hole H3 and the through-holes 41H and 43H. The insulating film 45 serves as a dielectric of the first holding capacitance C1 (refer to FIG. 2) and also as part of a dielectric of the second holding capacitance C2 (refer to FIG. 2).

The pixel electrode 51 is provided on the insulating film 45. The pixel electrode 51 covers the common electrode 41 with the insulating film 45 interposed therebetween. The pixel electrode 51 buries the third contact hole H3. With this configuration, the pixel electrode 51 is coupled to the drain 31d of the pixel transistor TR.

The following exemplifies materials constituting portions of the TFT substrate 100. The base material 1 is made of glass or a flexible resin substrate. The gate line GCL and the wiring COML (refer to FIG. 6) are made of a material containing molybdenum. The insulating film 13 is formed of inorganic films, such as a silicon oxide film and a silicon nitride film. For example, the insulating film 13 is formed of a laminated structure film obtained by stacking the silicon oxide film and the silicon nitride film in this order from the base material 1 side. The semiconductor film 21 is formed of a polysilicon film. Portions of this polysilicon film exposed from the gate line GCL contain impurities such as phosphorus or boron, and have conductivity. The semiconductor film 21 may be amorphous silicon or an oxide semiconductor film. The interlayer insulating film 23 is formed of inorganic films, such as a silicon oxide film and a silicon nitride film. For example, the interlayer insulating film 23 is formed of a laminated structure film obtained by stacking the silicon oxide film, the silicon nitride film, and the silicon oxide film in this order from the base material 1 side.

The signal line SGL (including the source 31s), the drain 31d, and the first relay portion rel1 are made of titanium and aluminum. For example, the signal line SGL, the drain 31d, and the first relay portion rel1 are each formed of a laminated structure film obtained by stacking titanium, aluminum, and titanium in this order from the base material 1 side. The planarizing film 33 is made of an organic film of, for example, an acrylic resin. The common electrode 41 is formed of an indium tin oxide (ITO) film serving as a light-transmitting conductive film. The reflective film 43 is made of molybdenum and aluminum. For example, the reflective film 43 is formed of a laminated structure film obtained by stacking molybdenum, aluminum, and molybdenum in this order from the base material 1 side. The reflective film 43 may be formed of silver (Ag) to increase reflectivity. The insulating film 45 is formed of an inorganic film, such as a silicon nitride film. The pixel electrode 51 is made of ITO that is a light-transmitting conductive material. Each of the pixel electrode 51 and the common electrode 41 is not limited to the light-transmitting conductive film, and may be formed of a reflective light blocking metal material.

The above-mentioned materials are mere examples. In the present embodiment, the portions of the TFT substrate 100 may be made of materials other than those mentioned above. For example, the gate line GCL and the wiring COML may each be formed of a film of aluminum, copper, silver, molybdenum, or an alloy of these materials. The signal line SGL, the drain 31d, and the first relay portion rel1 may each be made of a titanium-aluminum alloy that is an alloy of titanium and aluminum.

The following describes a method of manufacturing the TFT substrate 100 according to the first embodiment with reference to sectional views. FIGS. 11 to 14 are the sectional views for explaining the method of manufacturing the TFT substrate. FIGS. 11 to 14 correspond to the sectional view illustrated in FIG. 10, and illustrate a manufacturing process in this section.

Figure 11:
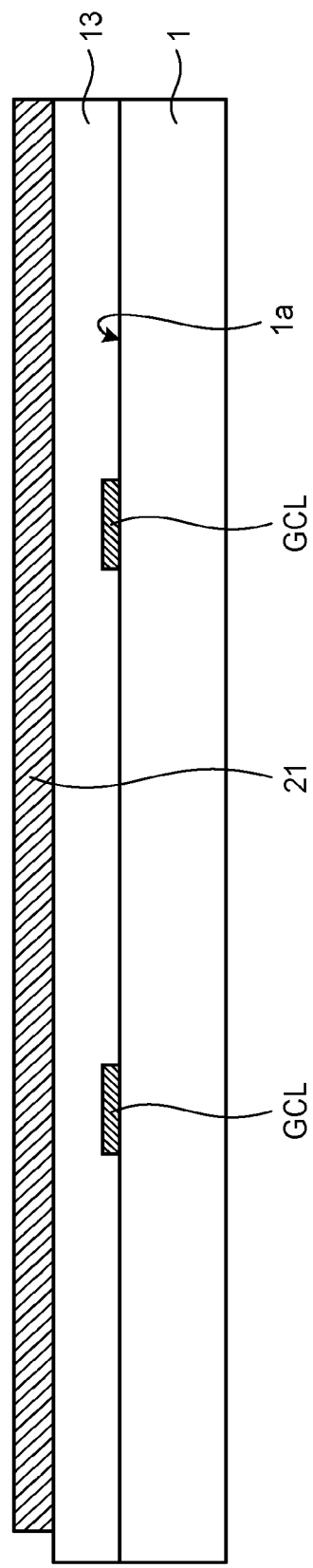
FIG. 11 is a sectional view for explaining a method of manufacturing the TFT substrate.

As illustrated in FIG. 11, a manufacturing apparatus (not illustrated) first forms a conductive film (not illustrated) of, for example, molybdenum on the base material 1. For example, a sputtering method is used to form the conductive film. The manufacturing apparatus then uses a photolithography technique and a dry etching technique to pattern the conductive film to form the gate line GCL and the wiring COML (refer to FIG. 6). For example, the manufacturing apparatus forms a resist (not illustrated) above the conductive film. The resist is patterned by the photolithography to be formed into a shape that covers regions in which the gate line GCL and the wiring COML are to be formed and that exposes the other regions. The manufacturing apparatus then uses the dry etching technique to remove the conductive film in the regions exposed from the resist. Whit this process, the gate line GCL and the wiring COML are formed from the conductive film. After forming the gate line GCL and the wiring COML, the manufacturing apparatus removes the resist.

The manufacturing apparatus then forms the insulating film 13 on the base material 1. The insulating film 13 is formed using, for example, a chemical vapor deposition (CVD) method. With this process, the gate line GCL and the wiring COML are covered with the insulating film 13.

The manufacturing apparatus then forms the semiconductor film on the insulating film 13. For example, the CVD method is used to form the semiconductor film. The manufacturing apparatus then uses the photolithography technique and the dry etching technique to pattern the semiconductor film. Accordingly, the manufacturing apparatus forms the semiconductor film 21 having the U-shape in the plan view. After forming the semiconductor film 21, the manufacturing apparatus removes the resist.

Figure 12:
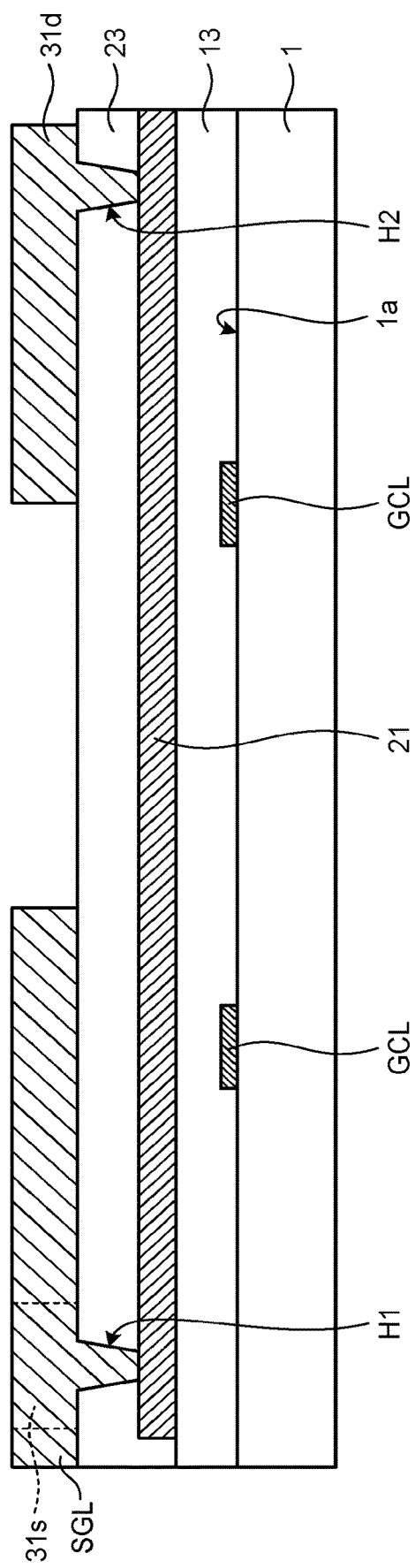
FIG. 12 is another sectional view for explaining the method of manufacturing the TFT substrate.

Then, as illustrated in FIG. 12, the manufacturing apparatus forms the interlayer insulating film 23 on the insulating film 13. For example, the CVD method is used to form the interlayer insulating film 23. With this process, the semiconductor film 21 is covered with the interlayer insulating film 23.

The manufacturing apparatus then forms the first contact hole H1, the second contact hole H2, and the through-hole 23H (refer to FIG. 6) in the interlayer insulating film 23. For example, the manufacturing apparatus uses the photolithography technique and the dry etching technique to pattern the interlayer insulating film 23 so as to form the first contact hole H1, the second contact hole H2, the through-hole 23H, and the through-hole 13H (refer to FIG. 6). While the semiconductor film 21 serving as an etching stopper is present under the first contact hole H1 and under the second contact hole H2, the semiconductor film 21 is not present under the through-hole 23H. Therefore, the through-hole 13H is continuously formed under the through-hole 23H. After forming the first contact hole H1, the second contact hole H2, the through-hole 23H, and the through-hole 13H, the manufacturing apparatus removes the resist.

The manufacturing apparatus then forms the signal line SGL (including the source 31s illustrated in FIG. 10), the drain 31d, and the first relay portion rel1 (refer to FIG. 6) on the interlayer insulating film 23. For example, the manufacturing apparatus forms a titanium layer, then an aluminum layer, and then another titanium layer as a metal film on the interlayer insulating film 23. For example, the sputtering method is used to form the metal film. The manufacturing apparatus then uses the photolithography technique and the dry etching technique to pattern the metal film. Accordingly, the manufacturing apparatus forms the signal line SGL coupled to the semiconductor film 21 through the first contact hole H1, the drain 31d coupled to the semiconductor film 21 through the second contact hole H2, and the first relay portion rel1 formed in island-like shapes in the plan view. The manufacturing apparatus then removes the resist.

Figure 13:
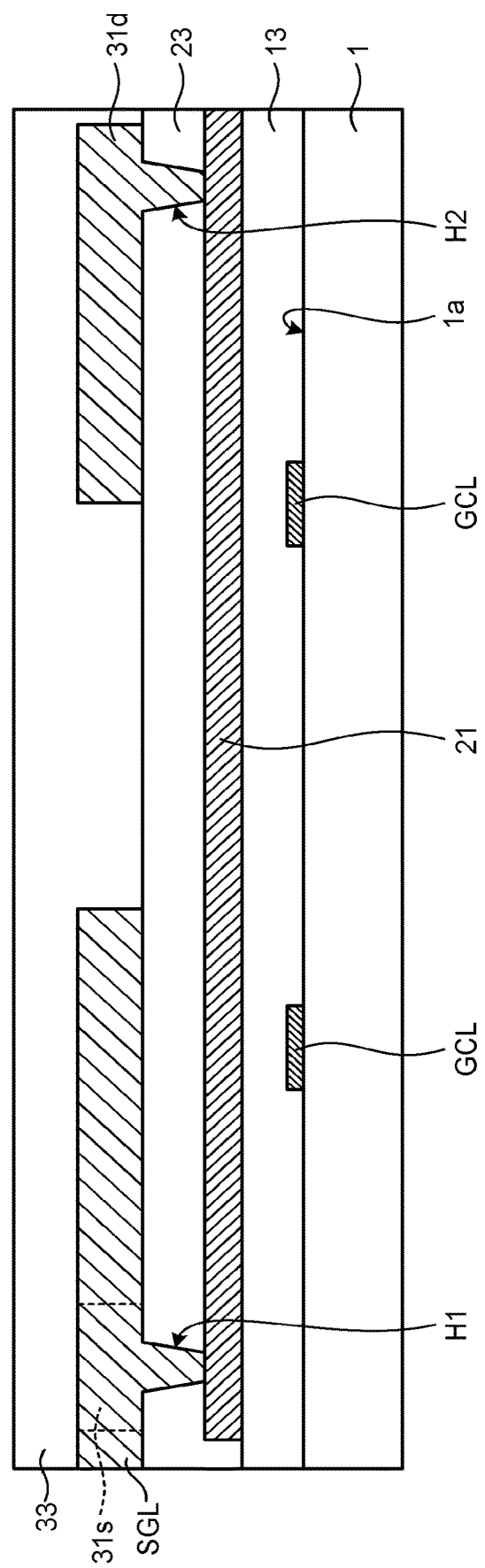
FIG. 13 is still another sectional view for explaining the method of manufacturing the TFT substrate.

Then, as illustrated in FIG. 13, the manufacturing apparatus forms the planarizing film 33 on the interlayer insulating film 23. The planarizing film 33 has an insulating property, and is, for example, an organic material, such as an acrylic resin. For example, a slit coat method or a spin coating method is used to form the planarizing film 33. With this process, the signal line SGL including the source 31s, the drain 31d, and the first relay portion rel1 are covered with the planarizing film 33. The planarizing film 33 can be increased in film thickness by using the organic material, such as the acrylic resin, as the planarizing film 33. This increase in film thickness can reduce parasitic capacitance between the common electrode 41 and the signal line SGL, and parasitic capacitance between the common electrode 41 and the drain 31d.

Figure 14:
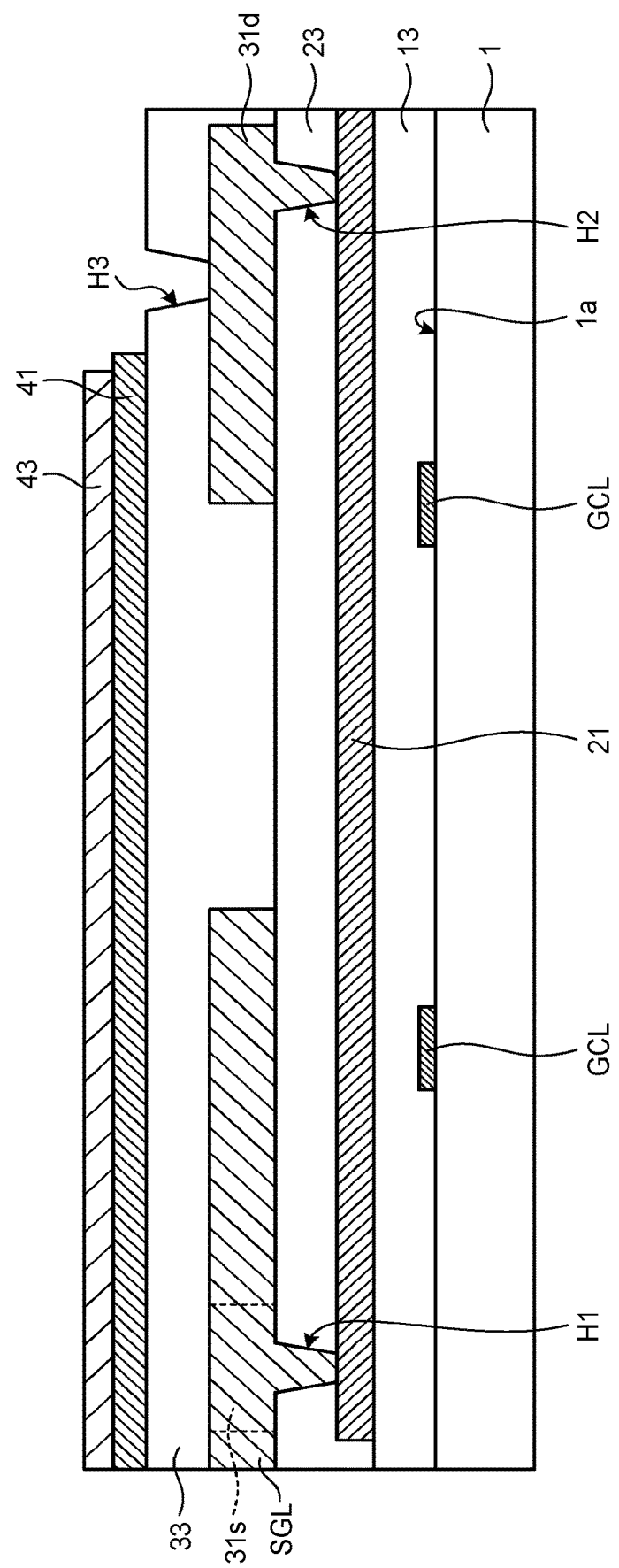
FIG. 14 is still another sectional view for explaining the method of manufacturing the TFT substrate.

Then, as illustrated in FIG. 14, the manufacturing apparatus forms the common electrode 41 and the reflective film 43 on the planarizing film 33. For example, the manufacturing apparatus forms a conductive film of, for example, ITO on the planarizing film 33. The manufacturing apparatus then sequentially forms a molybdenum film, an aluminum film, and another molybdenum film as a metal film on the conductive film. For example, the sputtering method is used to form each of the conductive film and the metal film. The manufacturing apparatus then uses the photolithography technique and the dry etching technique to pattern the metal film. Thus, the manufacturing apparatus forms the reflective film 43 having the through-hole 43H. The manufacturing apparatus then uses the photolithography technique and the dry etching technique to pattern the conductive film. Thus, the manufacturing apparatus forms the common electrode 41 having the through-hole 41H. After forming the common electrode 41, the manufacturing apparatus removes the resist.

The manufacturing apparatus then forms the third contact hole H3 in the planarizing film 33. For example, the manufacturing apparatus uses the photolithography technique and the dry etching technique to pattern the planarizing film 33 so as to form the third contact hole H3. After forming the third contact hole H3, the manufacturing apparatus removes the resist.

The manufacturing apparatus then forms the insulating film 45 (refer to FIG. 10) above the base material 1. For example, the CVD method is used to from the insulating film 45. With this process, the common electrode 41 and the reflective film 43 are covered with the insulating film 45. The internal surface and the bottom of the third contact hole H3 are also covered with the insulating film 45. The manufacturing apparatus then removes a portion of the insulating film 45 covering the bottom of the third contact hole H3. For example, the manufacturing apparatus uses the photolithography technique and the dry etching technique to pattern the insulating film 45 so as to remove the insulating film 45 from the bottom of the third contact hole H3. The manufacturing apparatus then removes the resist.

The manufacturing apparatus then forms the pixel electrode 51 (refer to FIG. 10) on the insulating film 45. For example, the manufacturing apparatus forms a conductive film of, for example, ITO on the insulating film 45. For example, the sputtering method is used to form the conductive film. The manufacturing apparatus then uses the photolithography technique and the dry etching technique to pattern the metal film. Thus, the manufacturing apparatus forms the pixel electrode 51 coupled to the drain 31d through the third contact hole H3. After forming the pixel electrode 51, the manufacturing apparatus removes the resist. The TFT substrate 100 according to the first embodiment is completed through the processes described above.

The following describes the structure of the display device 200 according to the first embodiment. FIG. 15 is a sectional view illustrating a configuration example of the display device according to the first embodiment. As illustrated in FIG. 15, the display device 200 according to the first embodiment includes the above-described TFT substrate 100, the counter substrate 130 disposed so as to face the TFT substrate 100, the electrophoretic layer 160 disposed between the TFT substrate 100 and the counter substrate 130, and a seal portion 152.

The counter substrate 130 includes a base material 131 and the counter electrode 133. The base material 131 is a light-transmitting glass substrate, a light-transmitting resin substrate, or a light-transmitting resin film. The counter electrode 133 is provided on a surface of the base material 131 facing the TFT substrate 100. The counter electrode 133 is formed of an ITO film serving as a light-transmitting conductive film. The counter electrode 133 faces the pixel electrode 51 with the electrophoretic layer 160 interposed therebetween.

The seal portion 152 is provided between the TFT substrate 100 and the counter substrate 130. The electrophoretic layer 160 is sealed in an internal space surrounded by the TFT substrate 100, the counter substrate 130, and the seal portion 152. The seal portion 152 is provided with a coupling member 153. The counter electrode 133 is coupled to the common electrode 41 of the TFT substrate 100 through the coupling member 153. With this configuration, the common potential VCOM is supplied to the counter electrode 133.

The electrophoretic layer 160 includes a plurality of microcapsules 163. A plurality of black fine particles 161, a plurality of white fine particles 162, and a dispersion liquid 165 are encapsulated in each of the microcapsules 163. The black fine particles 161 and the white fine particles 162 are dispersed in the dispersion liquid 165. The dispersion liquid 165 is a light-transmitting liquid, such as silicone oil. The black fine particles 161 are electrophoretic particles, and are made using, for example, negatively charged graphite. The white fine particles 162 are electrophoretic particles, and are made using, for example, a positively charged titanium oxide ($TiO_2$). The microcapsules 163 may contain fine particles in other colors except the black fine particles 161 and the white fine particles 162.

An electric field generated between the pixel electrode 51 and the counter electrode 133 changes the dispersion state of the black fine particles 161 and the white fine particles 162. The transmission state of light transmitted through the electrophoretic layer 160 changes with the dispersion state of the black fine particles 161 and the white fine particles 162. With this configuration, an image is displayed on a display surface. For example, when the common potential VCOM (at, for example, 0 V) is supplied to the counter electrode 133 and a negative potential is supplied to the pixel electrode 51, the negatively charged black fine particles 161 move toward the counter substrate 130, and the positively charged white fine particles 162 move toward the TFT substrate 100. As a result, when the TFT substrate 100 is viewed from the counter substrate 130 side, a region (pixel) overlapping with the pixel electrode 51 in the plan view is displayed in black.

Figure 16:
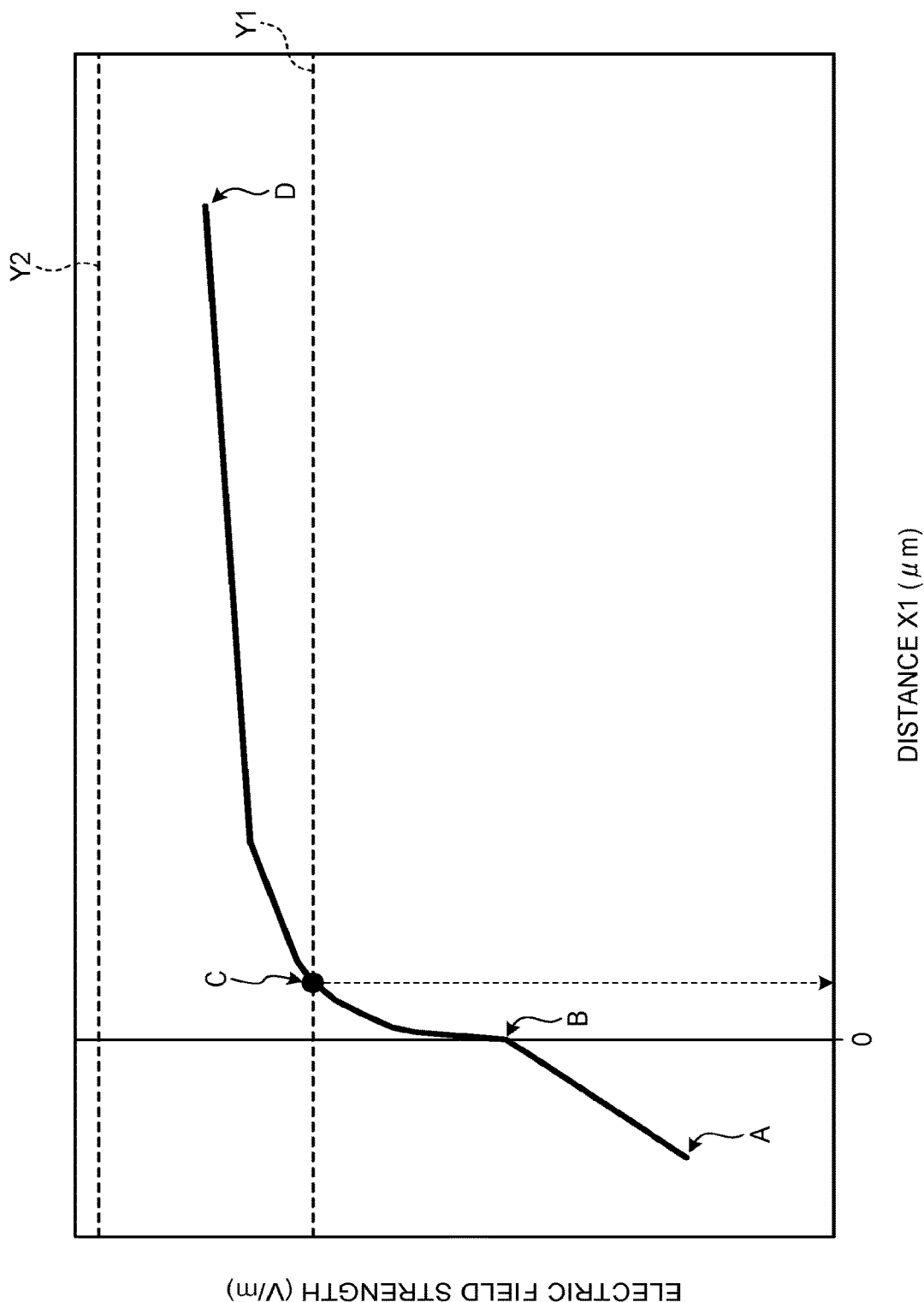
FIG. 16 is a graph illustrating a result obtained by investigating a relation between a distance from an outer periphery of the pixel electrode to an outer periphery of the common electrode and an electric field strength in one pixel.

FIG. 16 is a graph illustrating a result obtained by investigating a relation between the distance from the outer periphery of the pixel electrode to the outer periphery of the common electrode and an electric field strength in one pixel. The horizontal axis in FIG. 16 represents a horizontal distance X1 (μm) between a side on the outer periphery of the common electrode and a side on the outer periphery of the pixel electrode. The vertical axis in FIG. 16 represents a minimum value of the electric field immediately below the counter electrode in one pixel. In FIG. 16, when the value of the distance X1 is positive, the outer periphery of the common electrode is located inside the pixel electrode in the plan view. When the value of the distance X1 is negative, the outer periphery of the common electrode is located outside the pixel electrode in the plan view. When the value of the distance X1 is zero, the outer periphery of the common electrode overlaps with the outer periphery of the pixel electrode in the plan view.

Figure 17:
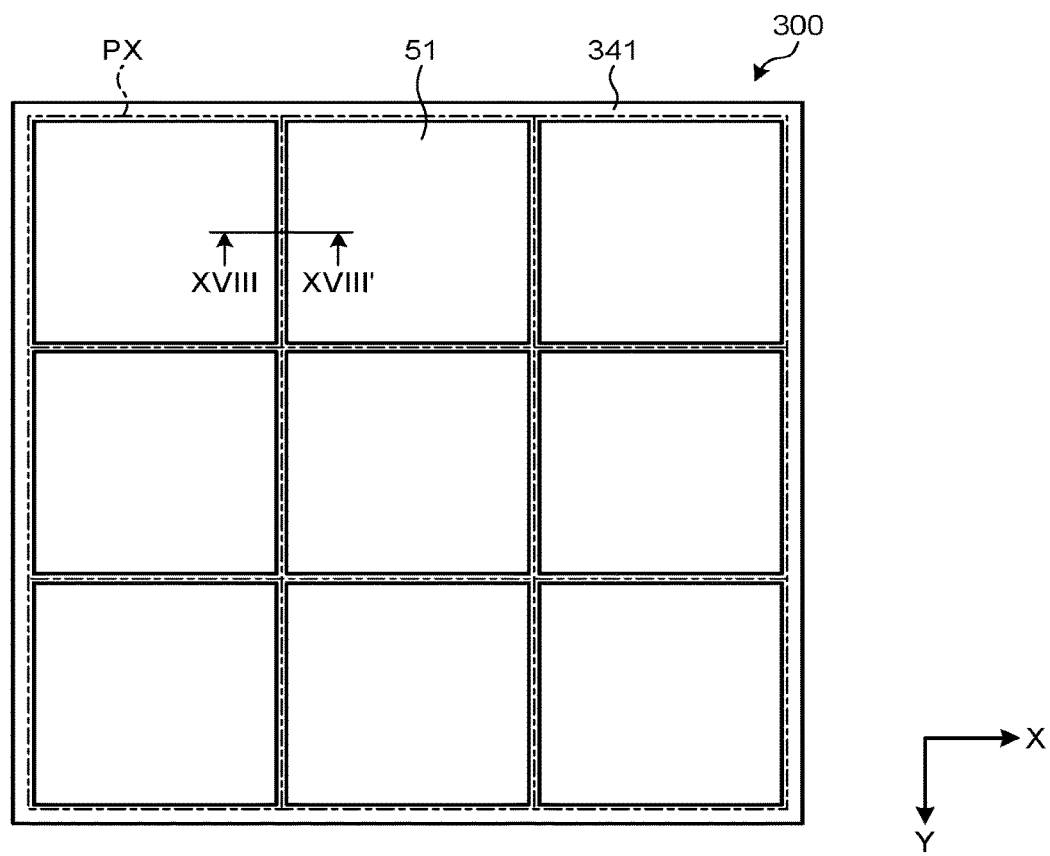
FIG. 17 is a plan view illustrating a configuration example of a TFT substrate according to a comparative example.
Figure 18:
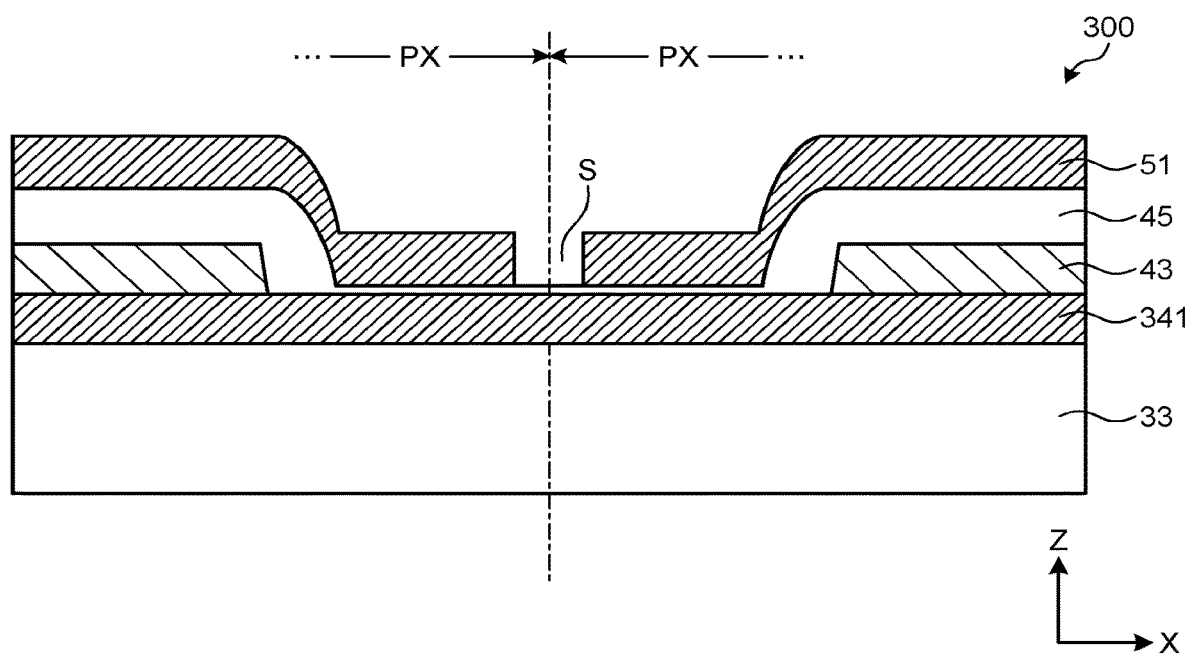
FIG. 18 is a sectional view obtained by cutting the plan view illustrated in FIG. 17 along line XVIII-XVIII'.

FIG. 17 is a plan view illustrating a configuration example of a TFT substrate according to a comparative example. FIG. 18 is a sectional view obtained by cutting the plan view illustrated in FIG. 17 along line XVIII-XVIII'. As illustrated in FIGS. 17 and 18, a TFT substrate 300 according to the comparative example includes a common electrode 341 that is a single piece between the adjacent pixels PX. In the TFT substrate 300, the one common electrode 341 is provided below the pixel electrodes 51 arranged in the X-direction and the Y-direction. The size of the common electrode 341 in the plan view is larger than the size of the pixel electrodes 51 in the plan view.

In FIG. 16, a point A corresponds to the TFT substrate 300 according to the comparative example described above. At the point A, the common electrode is a single piece between the adjacent pixels PX. A point B indicates a state where the outer periphery of the common electrode overlaps with the outer periphery of the pixel electrode. At the point B, the outer periphery of the common electrode is flush with the outer periphery of the pixel electrode in the vertical direction (Z-direction) orthogonally intersecting the horizontal plane (XY-plane). A point C indicates a state where the electric field strength is Y1 or higher. A point D indicates a state where the common electrode is not provided. The electric field strength at the point D is denoted as Y0. In FIG. 16, assuming the electric field strength Y0 as a reference, an electric field strength of −5 percent with respect to the reference is denoted as Y1, at which level a line is drawn, and an electric field strength of +5 percent with respect to the reference is denoted as Y2, at which level another line is drawn. The following expressions hold: Y1=0.95×Y0, and Y2=1.05×Y0.

It can be seen from FIG. 16 that increasing the value of the distance X1 increases the value of the electric field strength. It can also be seen that the rate of the increase in the electric field strength with respect to the distance X1 is larger between points B and C than between points A and B. In particular, it can be seen that the rate of the increase in the electric field strength with respect to the distance X1 sharply increases after the distance X1 exceeds zero. It can also be seen that the ratio of the amount of the increase in the electric field strength to the amount of increase in the distance X1 is smaller between points C and D than between points B and C.

As described above, the TFT substrate 100 according to the first embodiment includes the insulating base material 1, the pixel electrode 51 provided on the one surface 1a side of the base material 1, and the common electrode 41 provided between the base material 1 and the pixel electrode 51. All the sides 41L on the outer periphery of the common electrode 41 are located inside the pixel electrode 51 in the plan view. This configuration can prevent the electric field from leaking out from a gap S (refer to FIGS. 4 and 5) between one of the pixel electrodes 51 and another of the pixel electrodes 51 adjacent to each other (between the pixel electrodes 51), and thus can reduce the leakage electric field from the gap S between the pixel electrodes 51. Thus, the electric field strength in each of the pixels PX can be prevented from decreasing. Accordingly, the display device 200 using the TFT substrate 100 can reduce unevenness of display and prevent reduction in contrast, and therefore, can improve in display performance. The TFT substrate 100 and the display device 200 capable of improving the display performance can be provided.

The TFT substrate 100 further includes the coupling portion 50 provided between the base material 1 and the pixel electrode 51. The pixel electrodes 51 are arranged in the X-direction and the Y-direction intersecting the X-direction in the plan view. The common electrodes 41 are arranged in the X-direction and the Y-direction. The coupling portion 50 couples together the common electrodes 41 in at least one of the X-direction and the Y-direction. For example, the coupling portion 50 couples together the common electrodes 41 arranged in the X-direction. This configuration allows the TFT substrate 100 to supply the common potential VCOM through the coupling portion 50 to the common electrodes 41 arranged in the X-direction. The number of wires can be made smaller than that in a case where one wire is coupled to one common electrode to supply the common potential VCOM thereto.

The TFT substrate 100 also includes the gate line GCL extending in the X-direction between the base material 1 and the pixel electrode 51. The coupling portion 50 includes the wiring COML provided in the same layer as that of the gate line GCL. This configuration allows the manufacturing apparatus to simultaneously form the wiring COML and the gate line GCL in the same process, and thus can prevent increase in manufacturing processes. Since the wiring COML is provided in the same layer as that of the gate line GCL, the number of layers in the TFT substrate 100 can be prevented from increasing, which can contribute to reduction in thickness of the TFT substrate 100.

The coupling portion 50 is located in a layer below the common electrode 41 (i.e., on the base material 1 side). This configuration can keep the parasitic capacitance generated between the coupling portion 50 and the pixel electrode 51 lower than that in a case where the coupling portion 50 is located in the same layer as that of the common electrode 41 and a case where the coupling portion 50 is located in a layer above the common electrode 41.

Modifications

Figure 19:
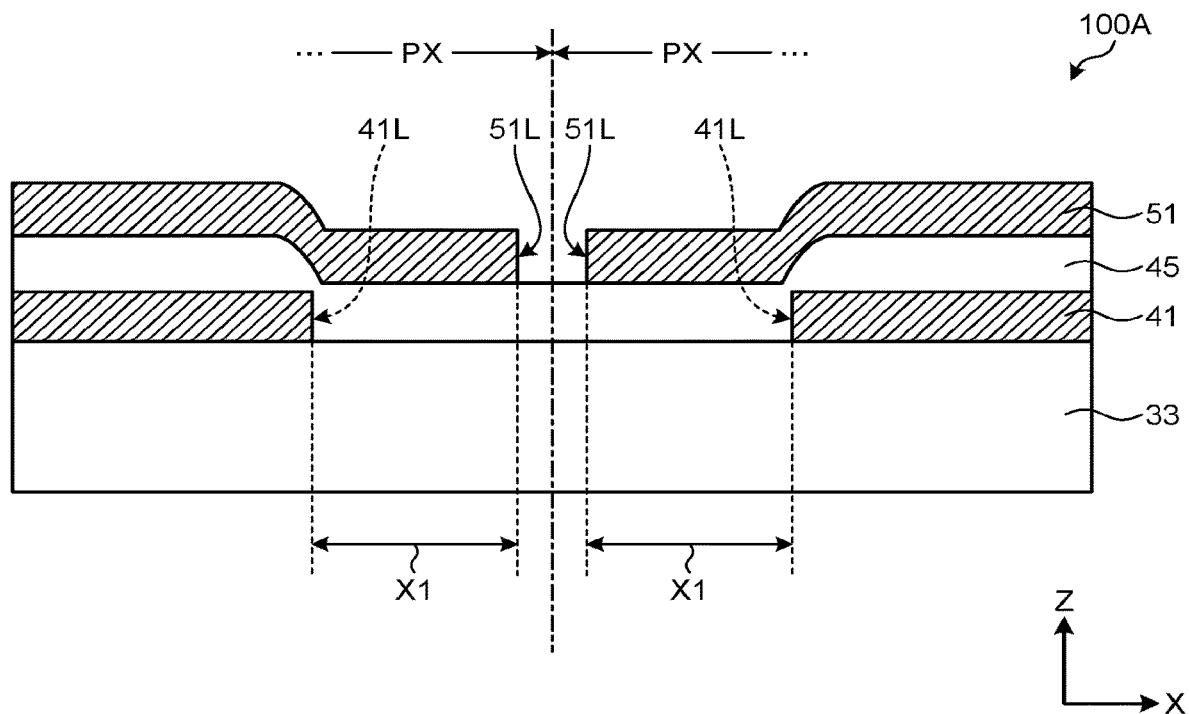
FIG. 19 is a sectional view illustrating a configuration example of a TFT substrate according to a first modification of the first embodiment.

In the above-described first embodiment, the description has been given that the reflective film 43 is provided on the common electrode 41. The reflective film 43 is, however, not essential in the first embodiment and in second, fourth, and fifth embodiments of the present invention to be described later. FIG. 19 is a sectional view illustrating a configuration example of a TFT substrate according to a first modification of the first embodiment.

FIG. 19 illustrates a section obtained by cutting a TFT substrate 100A according to the first modification of the first embodiment along the same position as line IV-IV' (refer to FIG. 3). For example, as seen in the TFT substrate 100A illustrated in FIG. 19, the reflective film 43 need not be disposed on the common electrode 41. Such an aspect can also provide the same effect as that of the above-described first embodiment.

In the above-described first embodiment, the description has been given that the pixel transistor TR is the bottom-gate transistor. However, in the present embodiment, the pixel transistor TR is not limited to the bottom gate transistor. The pixel transistor TR may be a top-gate transistor.

Figure 20:
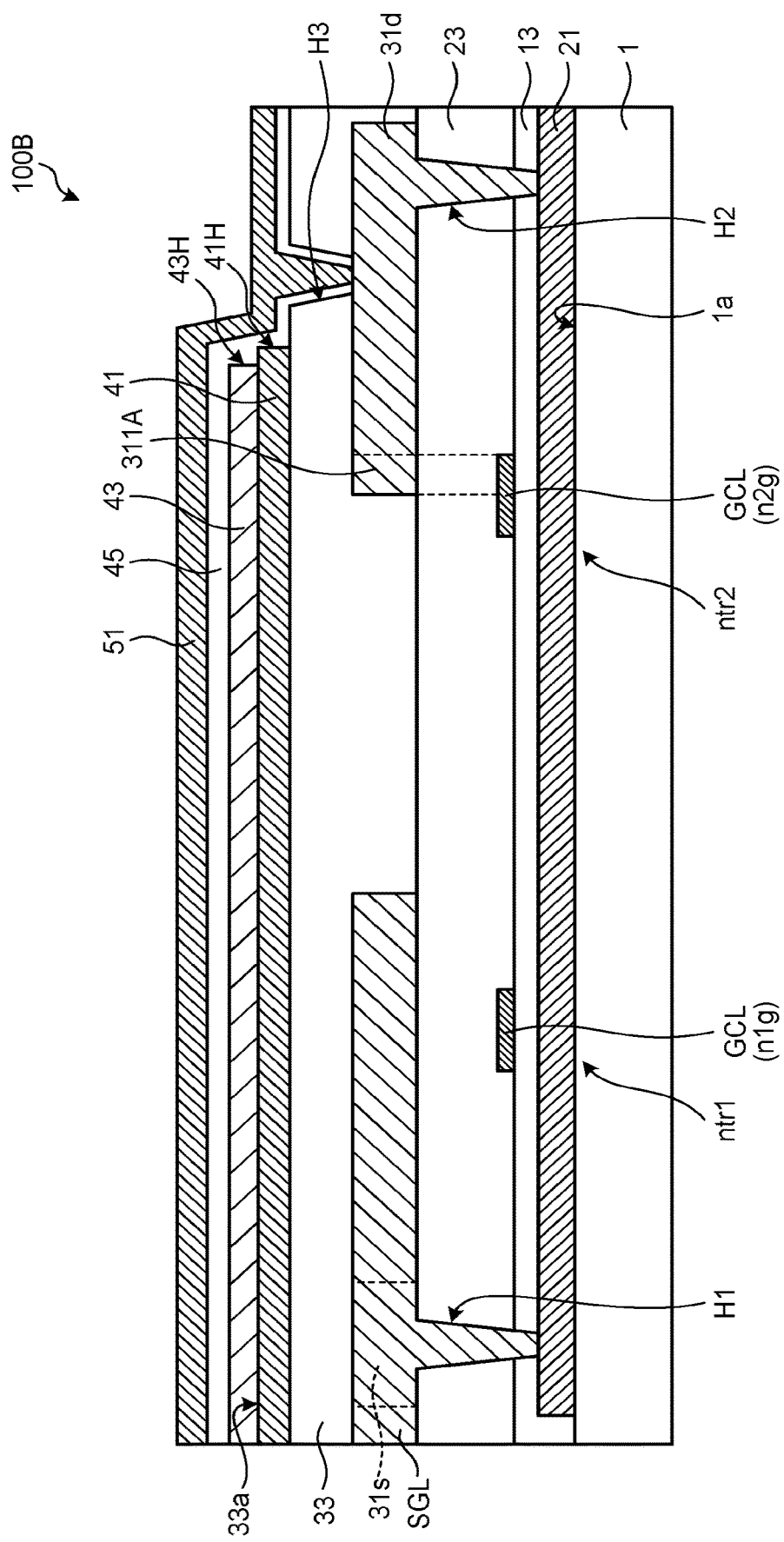
FIG. 20 is a sectional view illustrating a configuration example of a TFT substrate according to a second modification of the first embodiment.
Figure 21:
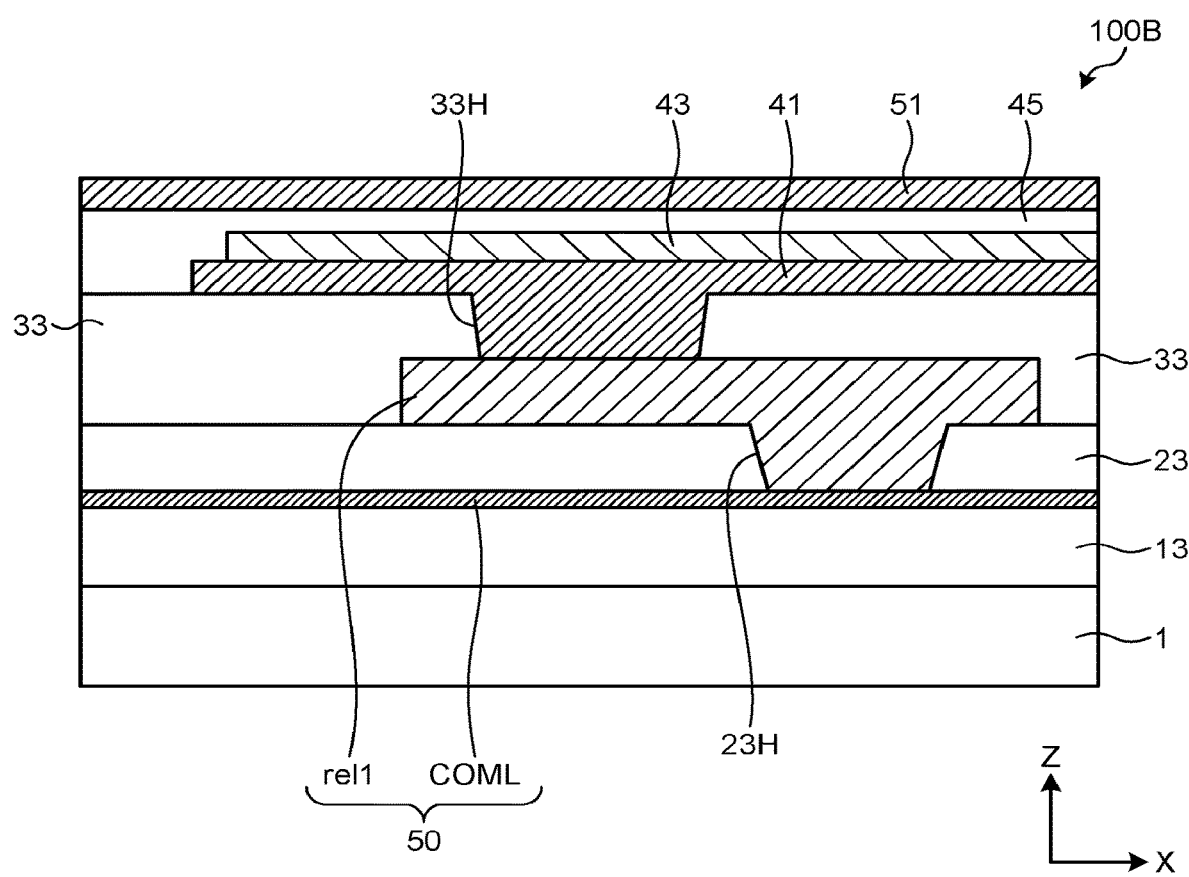
FIG. 21 is another sectional view illustrating the configuration example of the TFT substrate according to the second modification of the first embodiment.

FIGS. 20 and 21 are sectional views illustrating a configuration example of a TFT substrate according to a second modification of the first embodiment. FIG. 20 illustrates a section obtained by cutting a TFT substrate 100B according to the second modification of the first embodiment along the same position as line X-X' (refer to FIG. 9). FIG. 21 illustrates a section obtained by cutting the TFT substrate 100B according to the second modification of the first embodiment along the same position as line IV-IV' (refer to FIG. 3). For example, in the TFT substrate 100B illustrated in FIG. 20, the pixel transistor is the NMOS transistor NTR, and includes the top-gate first NMOS transistor ntr1 and the top-gate second NMOS transistor ntr2. In the TFT substrate 100B, the semiconductor film 21 is provided above the one surface 1a of the base material 1.

As illustrated in FIGS. 20 and 21, the insulating film 13 is provided on the one surface 1a of the base material 1. The insulating film 13 covers the semiconductor film 21. The gate line GCL and the wiring COML are provided on the insulating film 13. The wiring COML is coupled to the first relay portion rel1 through the through-hole 23H.

In the above-described first embodiment, the description has been given that the wiring COML is coupled to the common electrode 41 through the first relay portion rel1 (or the first relay portion rel1 and the second relay portion rel2). However, in the first embodiment, the coupling between the wiring COML and the common electrode 41 is not limited thereto. The wiring COML may be directly coupled to the common electrode 41 without the interposition of the first relay portion rel1 and the second relay portion rel2.

Second Embodiment

In the above-described first embodiment, the description has been given that the wiring COML included in the coupling portion 50 is provided in the same layer as that of the gate line GCL. However, in the present embodiment, the wiring COML may be provided in a layer different from that of the gate line GCL.

Figure 22:
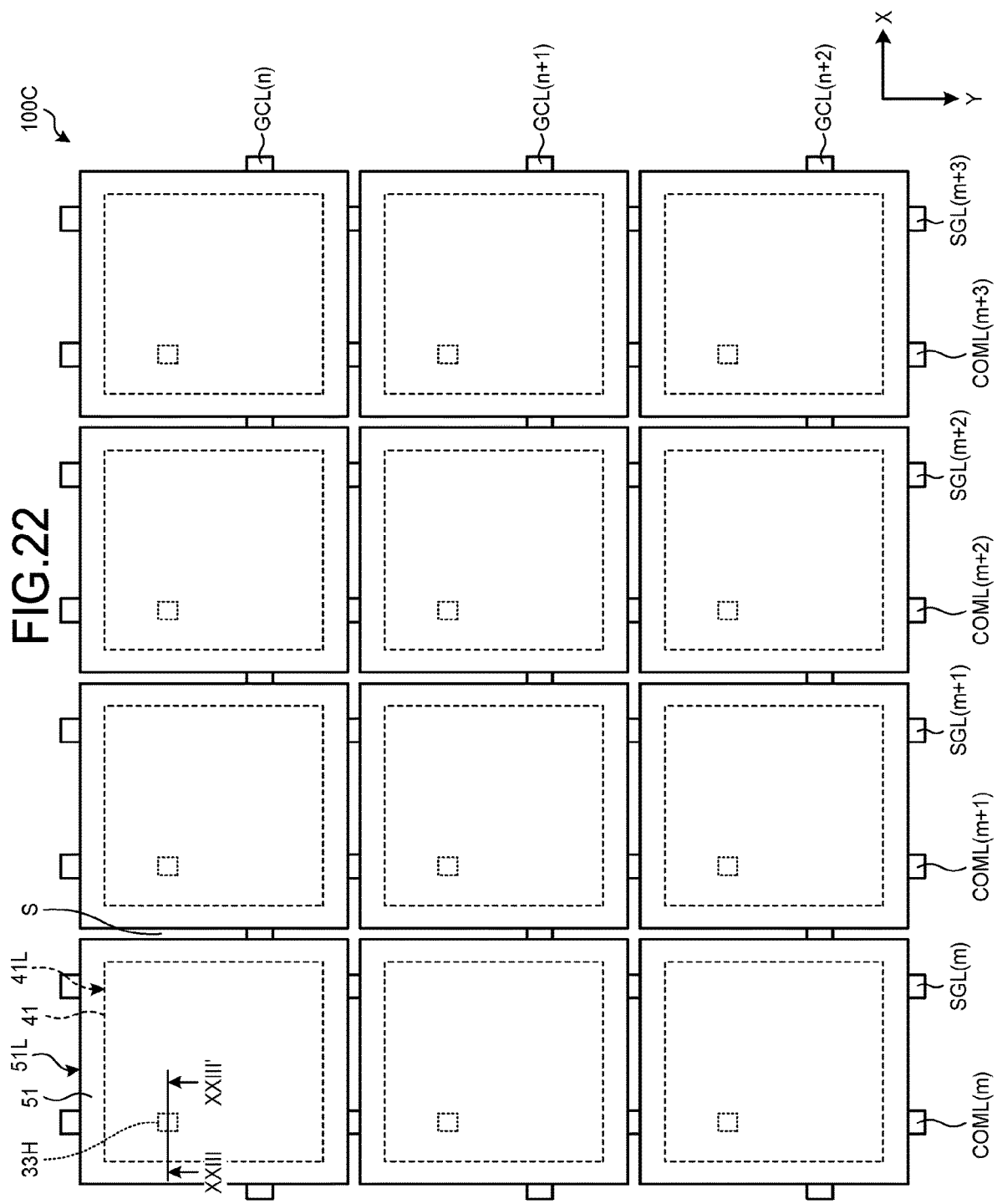
FIG. 22 is a plan view illustrating a configuration example of a TFT substrate according to a second embodiment of the present invention.
Figure 23:
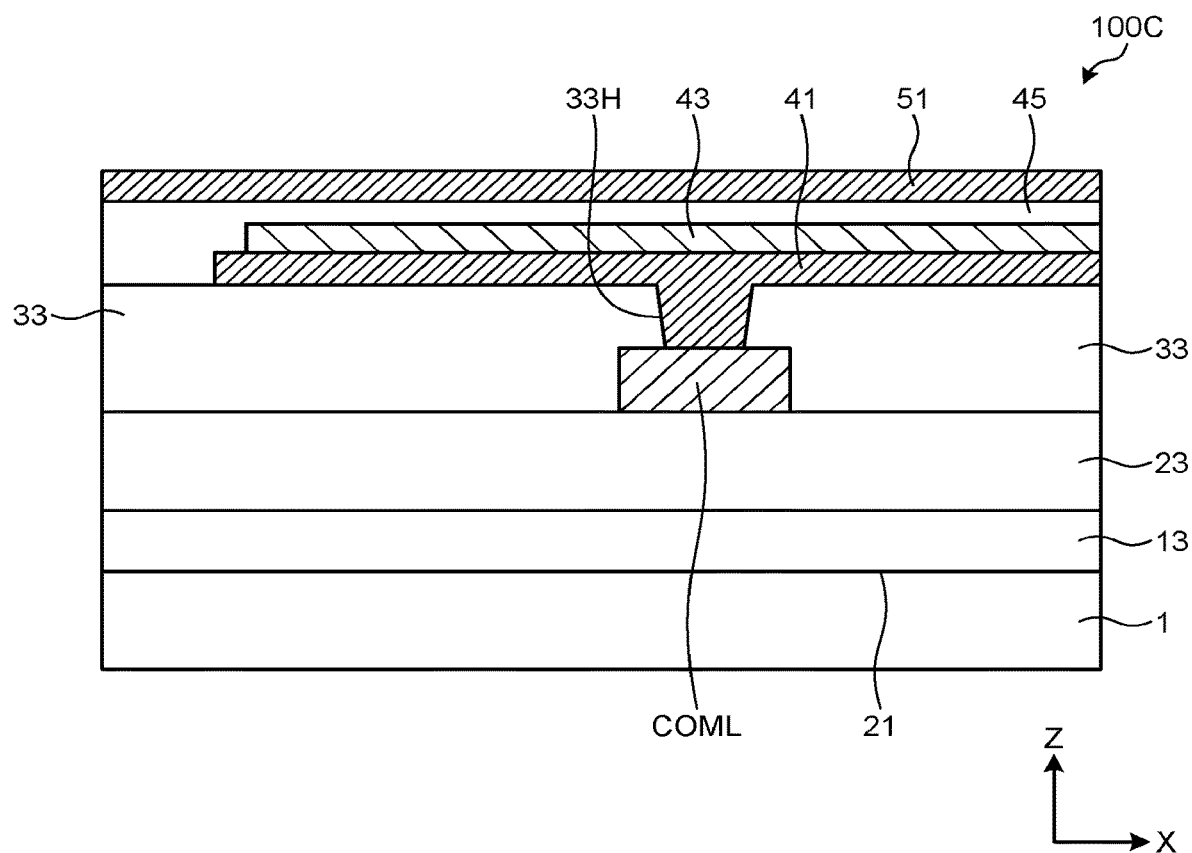
FIG. 23 is a sectional view illustrating a configuration example of the coupling portion according to the second embodiment.

FIG. 22 is a plan view illustrating a configuration example of a TFT substrate according to the second embodiment. FIG. 23 is a sectional view illustrating a configuration example of the coupling portion according to the second embodiment. The section illustrated in FIG. 23 is a section obtained by cutting the plan view illustrated in FIG. 22 along line XXIII-XXIII'. As illustrated in FIGS. 22 and 23, a TFT substrate 100C according to the second embodiment includes a coupling portion that couples together the common electrodes 41. For example, the coupling portion couples together the common electrodes 41 adjacent to each other in the Y-direction. The coupling portion is a plurality of lines of the wiring COML extending parallel to the signal lines SGL.

In the TFT substrate 100C, the lines of the wiring COML extend in the Y-direction, and are arranged in the X-direction. The lines of the wiring COML are arranged in the X-direction such that one of pixels PX overlaps with one line of the wiring COML in the plan view. The lines of the wiring COML and the signal lines SGL are alternately arranged in the X-direction. For example, the lines of the wiring COML and the signal lines SGL are arranged in the order of the line(m) of the wiring COML, the signal line SGL(m), the line(m+1) of the wiring COML, the signal line SGL(m+1), . . . in the X-direction. With this arrangement, each of the gate lines GCL orthogonally intersects the wiring COML and the signal lines SGL in the plan view.

The wiring COML is provided in the same layer as that of the signal line SGL. The wiring COML is made of a material having the same composition as that of the signal line SGL. The wiring COML and the signal line SGL are simultaneously formed in the same process.

As illustrated in FIG. 23, the wiring COML is provided on the interlayer insulating film 23, and is covered with the planarizing film 33. The planarizing film 33 is provided with a through-hole 33H. The common electrode 41 is provided on the planarizing film 33, and buries the through-hole 33H. With this configuration, the wiring COML is coupled to the common electrode 41. The wiring COML is supplied with the common potential VCOM (at, for example, 0 V) from the power supply circuit, which is not illustrated. The common potential VCOM supplied to the wiring COML is, in turn, supplied to the common electrode 41.

Also in the TFT substrate 100C according to the second embodiment, all the sides 41L on the outer periphery of the common electrode 41 are located inside the pixel electrode 51. This configuration can prevent the electric field from leaking out from the gap S between the pixel electrodes 51, and thus can reduce the leakage electric field from the gap S between the pixel electrodes 51. Thus, the TFT substrate 100C according to the second embodiment provides the same effect as that of the TFT substrate 100 according to the first embodiment.

The coupling portion 50 couples together the common electrodes 41 arranged in the Y-direction. This configuration allows the TFT substrate 100C to supply the common potential VCOM through the coupling portion 50 to the common electrodes 41 arranged in the Y-direction. The number of wires can be smaller than that in the case where one wire is coupled to one common electrode to supply the common potential VCOM thereto.

The TFT substrate 100C also includes the signal line SGL extending in the Y-direction between the base material 1 and the pixel electrode 51. The coupling portion 50 includes the wiring COML provided in the same layer as that of the signal line SGL. This configuration allows the manufacturing apparatus to simultaneously form the wiring COML and the signal line SGL in the same process, and thus can prevent increase in manufacturing processes. Since the wiring COML is provided in the same layer as that of the signal line SGL, the number of layers in the TFT substrate 100C can be prevented from increasing, which can contribute to reduction in thickness of the TFT substrate 100C.

Also in the TFT substrate 100C, the wiring COML is located in a layer below the common electrode 41 (i.e., on the base material 1 side). This configuration can keep the parasitic capacitance generated between the wiring COML and the pixel electrode 51 lower than that in a case where the wiring COML is located in the same layer as that of the common electrode 41 and a case where the wiring COML is located in a layer above the common electrode 41.

Modification

In the present embodiment, the pixel transistor TR may include a p-channel metal-oxide semiconductor (PMOS) transistor instead of the NMOS transistor TR. In the present embodiment, the pixel transistor TR may include both the NMOS transistor and the PMOS transistor. The following specifically describes a case where the pixel transistor TR includes both the NMOS transistor and the PMOS transistor as a modification of the second embodiment.

Figure 24:
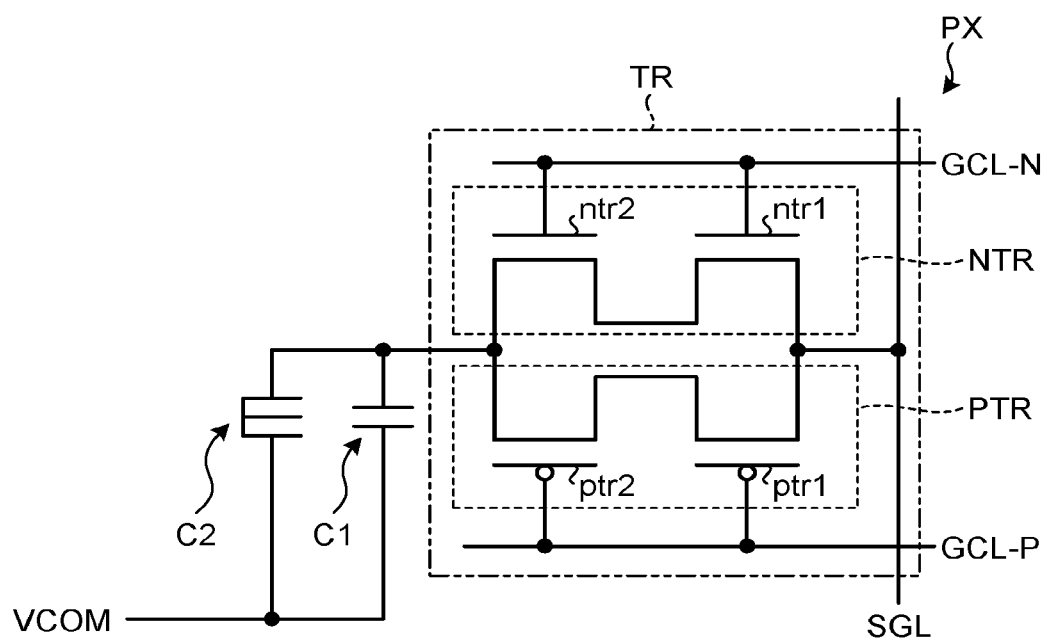
FIG. 24 is a circuit diagram illustrating a configuration example of one pixel in a TFT substrate according to a modification of the second embodiment.

FIG. 24 is a circuit diagram illustrating a configuration example of one pixel in a TFT substrate according to the modification of the second embodiment. As illustrated in FIG. 24, the pixel transistor TR includes the NMOS transistor NTR and a PMOS transistor PTR coupled in parallel to the NMOS transistor NTR. The PMOS transistor PTR includes a first PMOS transistor ptr1 and a second PMOS transistor ptr2. The first PMOS transistor ptr1 is coupled in series to the second PMOS transistor ptr2.

Figure 25:
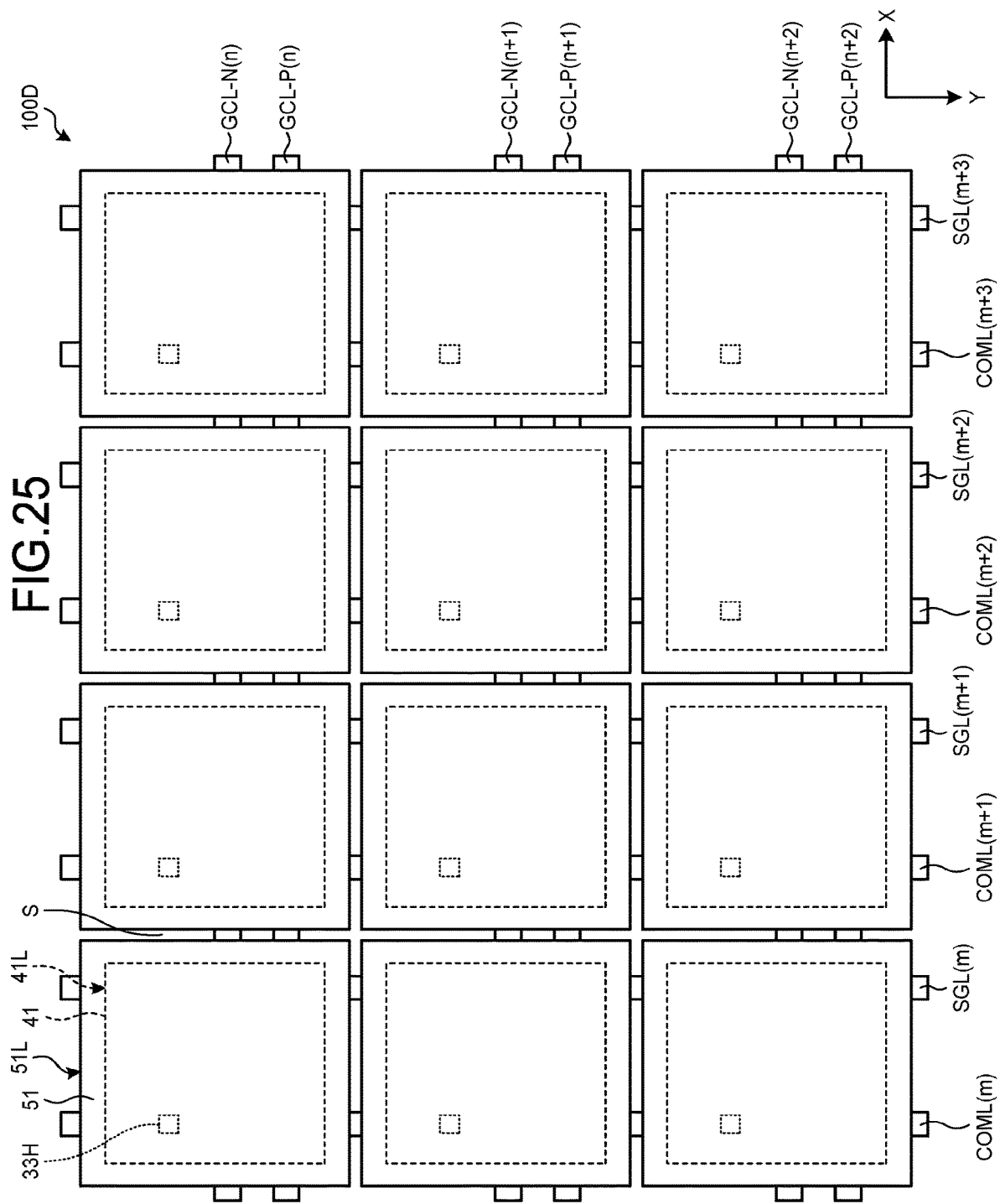
FIG. 25 is a plan view illustrating a configuration example of the TFT substrate according to the modification of the second embodiment.

FIG. 25 is a plan view illustrating a configuration example of the TFT substrate according to the modification of the second embodiment. In a TFT substrate 100D according to the modification of the second embodiment, a plurality of first gate lines GCL-N extend in the X-direction, and are arranged in the Y-direction. A plurality of second gate lines GCL-P also extend in the X-direction, and are arranged in the Y-direction. The first gate lines GCL-N and the second gate lines GCL-P are alternately arranged in the Y-direction. For example, the first gate lines GCL-N and the second gate lines GCL-P are arranged in the Y-direction in the order of the first gate line GCL-N(n), the second gate line GCL-P(n), the first gate line GCL-N(n+1), the second gate line GCL-P(n+1), . . . .

Each of the signal lines SGL orthogonally intersects the first gate lines GCL-N and the second gate lines GCL-P in the plan view. Each of the lines of the wiring COML arranged in the same layer as that of the signal lines SGL also orthogonally intersects the first gate lines GCL-N and the second gate lines GCL-P in the plan view.

As illustrated in FIG. 24, the gates of the NMOS transistor NTR are coupled to the first gate line GCL-N. The source of the NMOS transistor NTR is coupled to the signal line SGL. The drain of the NMOS transistor NTR is coupled to the pixel electrode 51. The gates of the PMOS transistor PTR are coupled to the second gate line GCL-P. The source of the PMOS transistor PTR is coupled to the signal line SGL. The drain of the PMOS transistor PTR is coupled to the pixel electrode 51.

Each of the first gate lines GCL-N and the second gate lines GCL-P is coupled to the gate driver 110 (refer to FIG. 1). The gate driver 110 generates a first gate drive signal and a second gate drive signal based on the signal output from the above-described control circuit. The gate driver 110 supplies the first gate drive signal to the first gate lines GCL-N, and supplies the second gate drive signal to the second gate lines GCL-P.

In the present embodiment, the pixel transistor TR may have a complementary metal-oxide semiconductor (CMOS) configuration as described above. With this configuration, compared with a case where the pixel transistor TR does not have the CMOS configuration, the voltage amplitude applied to each of the NMOS transistor NTR and the PMOS transistor PTR can be reduced, and withstand voltages of the PMOS transistor PTR and the NMOS transistor NTR constituting the pixel transistor TR can be reduced.

Third Embodiment

In each of the first and second embodiments described above, the case has been described where the wiring COML serving as the coupling portion 50 is provided in the same layer as that of the gate lines GCL or the signal lines SGL. However, in the present embodiment, the coupling portion for coupling together the common electrodes is not limited thereto. In the present embodiment, the coupling portion may be integrally formed with the reflective film 43.

Figure 26:
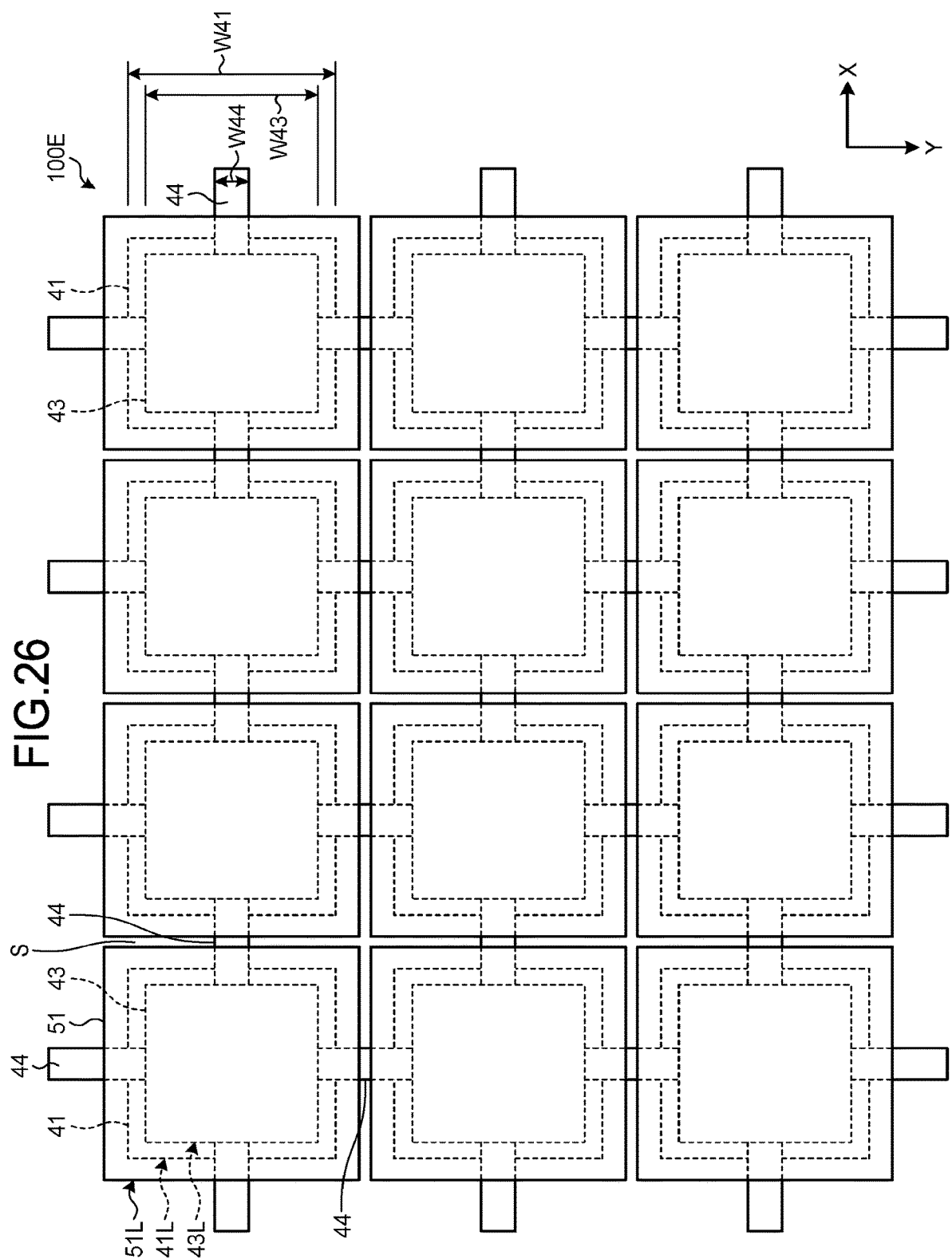
FIG. 26 is a plan view illustrating a configuration example of a TFT substrate according to a third embodiment of the present invention.

FIG. 26 is a plan view illustrating a configuration example of a TFT substrate according to a third embodiment of the present invention. In a TFT substrate 100E according to the third embodiment, a coupling portion 44 for coupling together the reflective films 43 is made of a material having the same composition as that of the reflective film 43, and is integrally formed with the reflective film 43. The coupling portion 44 and the reflective film 43 are simultaneously formed in the same process. The reflective film 43 and the coupling portion 44 are provided on a surface of the common electrode 41 facing the pixel electrode 51.

As illustrated in FIG. 26, the shape in the plan view of each of the common electrode 41 and the reflective film 43 is a rectangle, such as a square. The coupling portions 44 are coupled to the respective sides 43L on the outer periphery of the reflective film 43, on a one-to-one basis. With this configuration, the coupling portions 44 couple together the reflective films 43 arranged in the X-direction, and couple together the reflective films 43 arranged in the Y-direction. The coupling portions 44 couple together the reflective films 43 adjacent to each other in the X-direction and the Y-direction. The reflective films 43 have conductivity, and are in contact with the common electrodes 41. Accordingly, the coupling portions 44 couple together the common electrodes 41 adjacent to each other in the X-direction and the Y-direction through the reflective films 43 in contact with the common electrodes 41. A width of the common electrode 41 (i.e. a length in the X-direction or the Y-direction) is denoted as W41. A width of the reflective film 43 is denoted as W43. A width of the coupling portion 44 is denoted as W44. The width W44 of the coupling portion 44 is smaller than the width W41 of the common electrode 41, and smaller than the width W43 of the reflective film 43. The following expression holds: W41>W43>W44.

According to the TFT substrate 100E of the third embodiment, all the sides 41L on the outer periphery of the common electrode 41 are located inside the pixel electrode 51 in the plan view. The width W44 of the coupling portion 44 passing under the gap S between the pixel electrodes 51 is smaller than the width W41 of the common electrode 41, and smaller than the width W43 of the reflective film 43. This configuration can prevent the electric field from leaking out from the gap between the pixel electrodes 51, and thus can reduce the leakage electric field from the gap S between the pixel electrodes 51.

The manufacturing apparatus can simultaneously form the coupling portion 44 and the reflective film 43 in the same process, and thus can prevent increase in manufacturing processes. Since the coupling portion 44 is provided in the same layer as that of the reflective film 43, the number of layers in the TFT substrate 100E can be prevented from increasing, which can contribute to reduction in thickness of the TFT substrate 100E.

Fourth Embodiment

Figure 27:
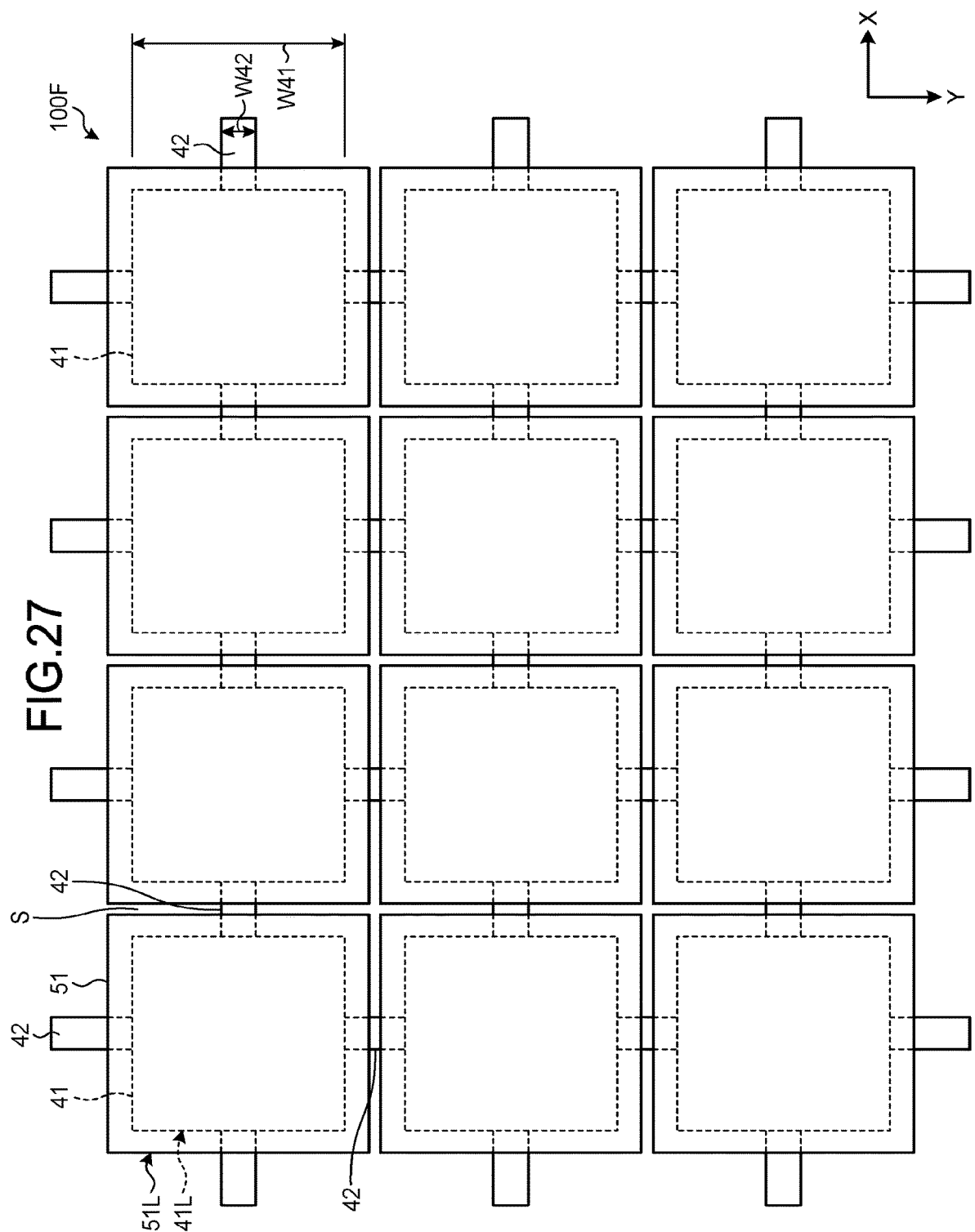
FIG. 27 is a plan view illustrating a configuration example of a TFT substrate according to a fourth embodiment of the present invention.

In the fourth embodiment, the coupling portion for coupling together the common electrodes may be integrally formed with the common electrode 41. FIG. 27 is a plan view illustrating a configuration example of a TFT substrate according to the fourth embodiment. In a TFT substrate 100F according to the fourth embodiment, a coupling portion 42 for coupling together the common electrodes 41 is made of a material having the same composition as that of the common electrode 41, and is integrally formed with the common electrode 41. The coupling portion 42 and the common electrode 41 are simultaneously formed in the same process.

As illustrated in FIG. 27, the shape in the plan view of the common electrode 41 is a rectangle, such as a square. The coupling portions 42 are coupled to the respective sides 41L on the outer periphery of the common electrode 41, on a one coupling portion-to-one side basis. With this configuration, the coupling portions 42 couple together the common electrodes 41 adjacent to each other in the X-direction and the Y-direction. The width of the common electrode 41 (i.e. a length in the X-direction or the Y-direction) is denoted as W41. A width of the coupling portion 42 is denoted as W42. The width W42 of the coupling portion 42 is smaller than the width W41 of the common electrode 41. The following expression holds: W41>W42.

According to the TFT substrate 100F of the fourth embodiment, all the sides 41L on the outer periphery of the common electrode 41 are located inside the pixel electrode 51 in the plan view. The width W42 of the coupling portion 42 passing under the gap S between the pixel electrodes 51 is smaller than the width W41 of the common electrode 41. This configuration can prevent the electric field from leaking out from the gap between the pixel electrodes 51, and thus can reduce the leakage electric field from the gap S between the pixel electrodes 51.

The manufacturing apparatus can simultaneously form the coupling portion 42 and the common electrode 41 in the same process, and thus can prevent increase in manufacturing processes. Since the coupling portion 42 is provided in the same layer as that of the common electrode 41, the number of layers in the TFT substrate 100F can be prevented from increasing, which can contribute to reduction in thickness of the TFT substrate 100F.

Fifth Embodiment

Figure 28:
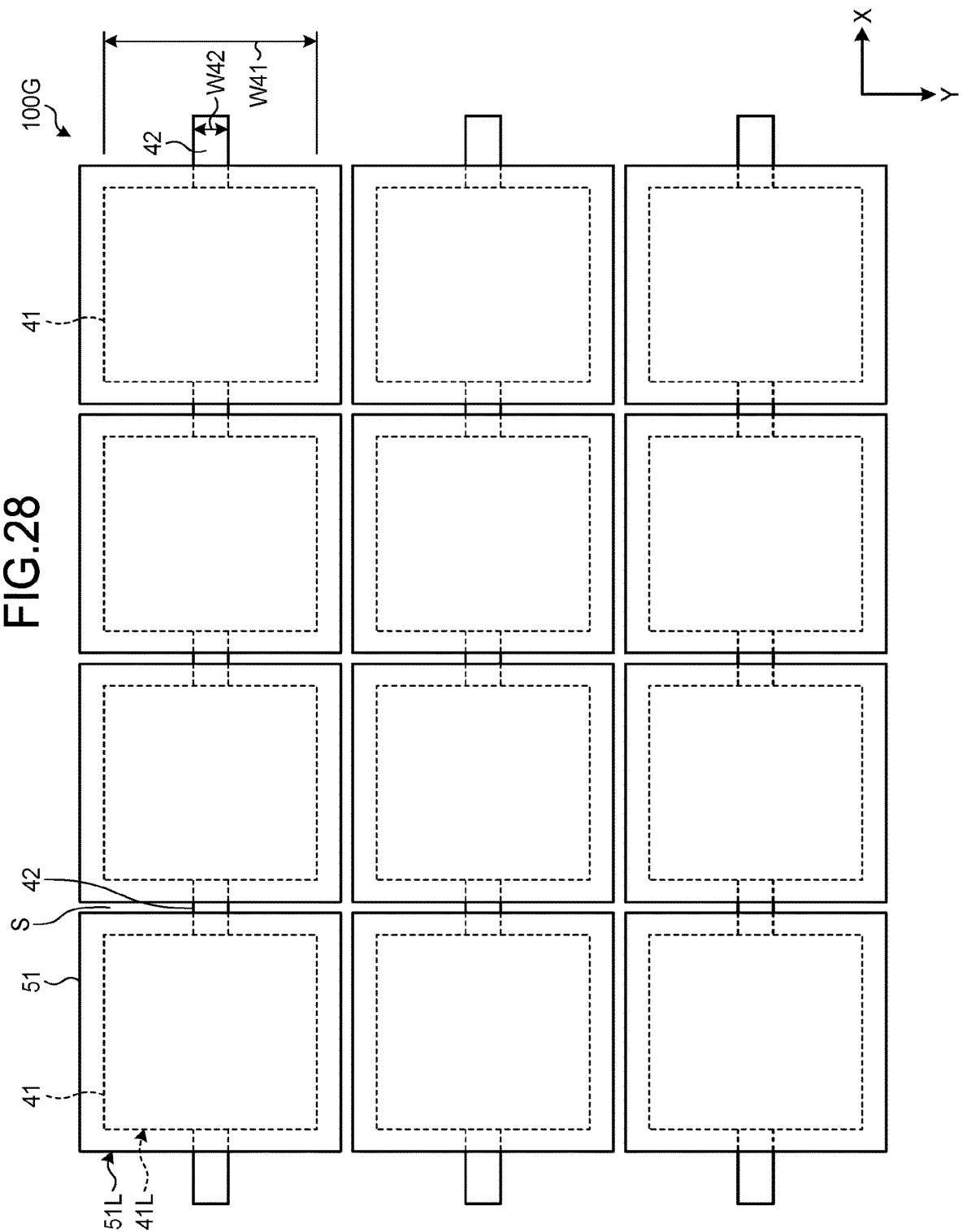
FIG. 28 is a plan view illustrating a configuration example of a TFT substrate according to a fifth embodiment of the present invention.

In the above-described fourth embodiment, the description has been given that the coupling portions 42 couple together the common electrodes 41 adjacent to each other in the X-direction and the Y-direction. The coupling portions 42 may, however, couple together the common electrodes adjacent to each other in one of the X-direction and the Y-direction, instead of in both the X-direction and the Y-direction. FIG. 28 is a plan view illustrating a configuration example of a TFT substrate according to the fifth embodiment. In a TFT substrate 100G according to the fifth embodiment, the coupling portion 42 integrally formed with the common electrode 41 couples together the common electrode 41 adjacent to each other in the X-direction.

According to the TFT substrate 100G of the fifth embodiment, all the sides 41L on the outer periphery of the common electrode 41 are located inside the pixel electrode 51 in the plan view. The width W42 of the coupling portion 42 is smaller than the width W41 of the common electrode 41. This configuration can prevent the electric field from leaking out from the gap between the pixel electrodes 51, and thus can reduce the leakage electric field from the gap S between the pixel electrodes 51.

Modification

Figure 29:
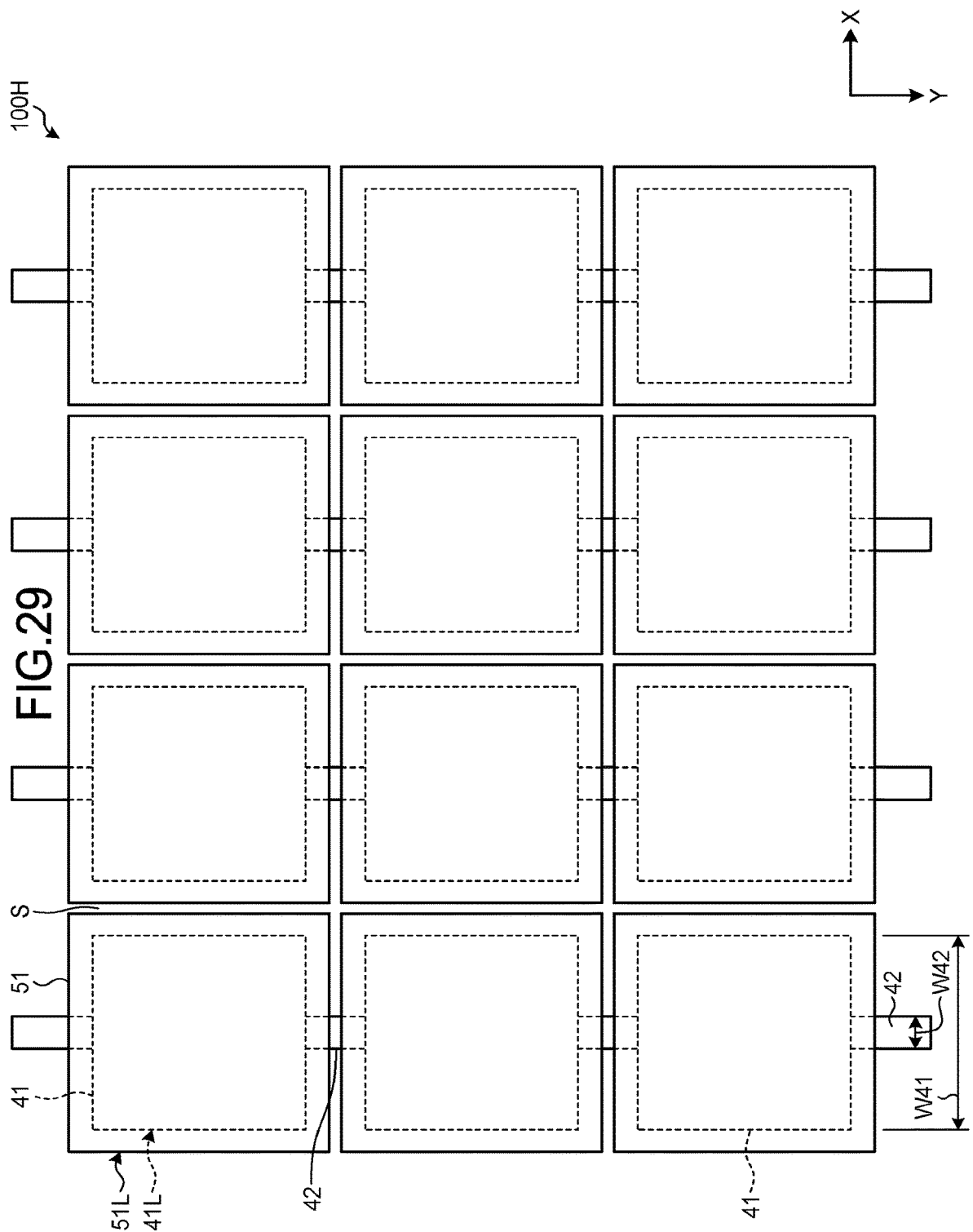
FIG. 29 is a plan view illustrating a configuration example of a TFT substrate according to a modification of the fifth embodiment.

FIG. 29 is a plan view illustrating a configuration example of a TFT substrate according to a modification of the fifth embodiment. In a TFT substrate 100H according to the modification of the fifth embodiment, the coupling portion 42 integrally formed with the common electrode 41 couples together the common electrode 41 adjacent to each other in the Y-direction. Such an aspect can also provide the same effect as that of the above-described fifth embodiment.

In JP-A-2011-221097 mentioned above, as illustrated in FIG. 5 thereof, a portion of a second storage capacitor 71B (corresponding to the common electrode) protrudes from a first storage capacitor 51A (corresponding to the pixel electrode) in the plan view. In the second storage capacitor 71B, the width in the vertical direction of FIG. 5 of the portion protruding from the first storage capacitor 51A is the same as the width in the vertical direction of FIG. 5 of a portion covered with the first storage capacitor 51A. Therefore, the electric field leaking from a gap between the first storage capacitors 51A in JP-A-2011-221097 is considered to larger than that in the fifth embodiment.

Sixth Embodiment

When the second storage capacitor 71B (corresponding to the common electrode) described in JP-A-2011-221097 is a solid film, unevenness in potential is likely to occur in a region surrounded by corners of four of the pixel electrodes 51 adjacent in the X-direction and the Y-direction. The amount of electric field applied to the pixel electrodes 51 is estimated to be smaller in the region surrounded by the corners of the four pixel electrodes 51 adjacent in the X-direction and the Y-direction. Therefore, in the display device 200 according to a sixth embodiment of the present invention, the common electrode 41 is formed of a conductive film, and the common electrodes 41 include a plurality of conductive film non-forming regions 41S that are holes of the conductive film in the plan view. The following describes in detail differences of the display device 200 according to the sixth embodiment from the display device 200 according to the first embodiment, and a description of the same configuration is omitted.

Figure 30:
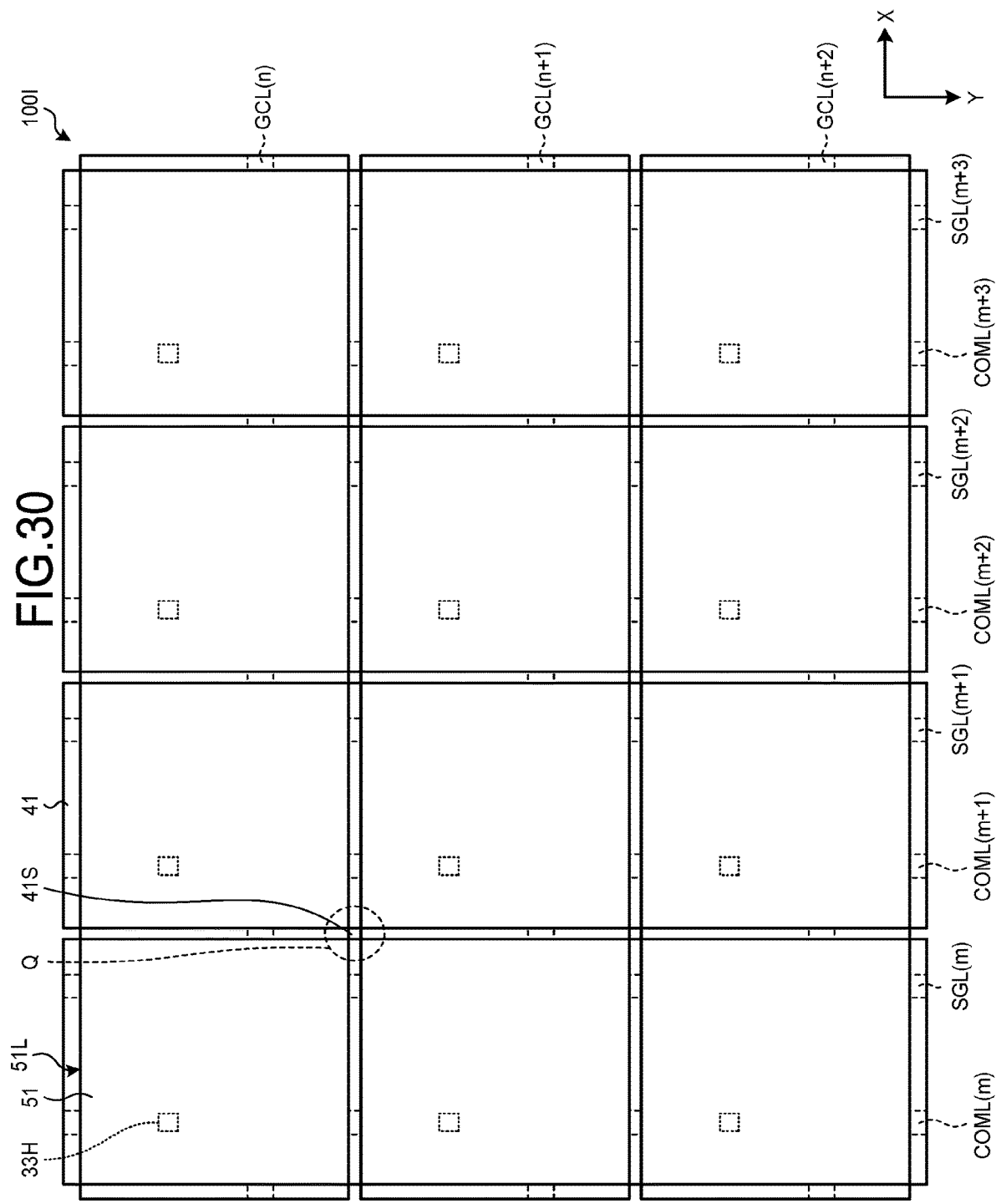
FIG. 30 is a plan view illustrating a configuration example of a TFT substrate according to a sixth embodiment of the present invention.
Figure 31:
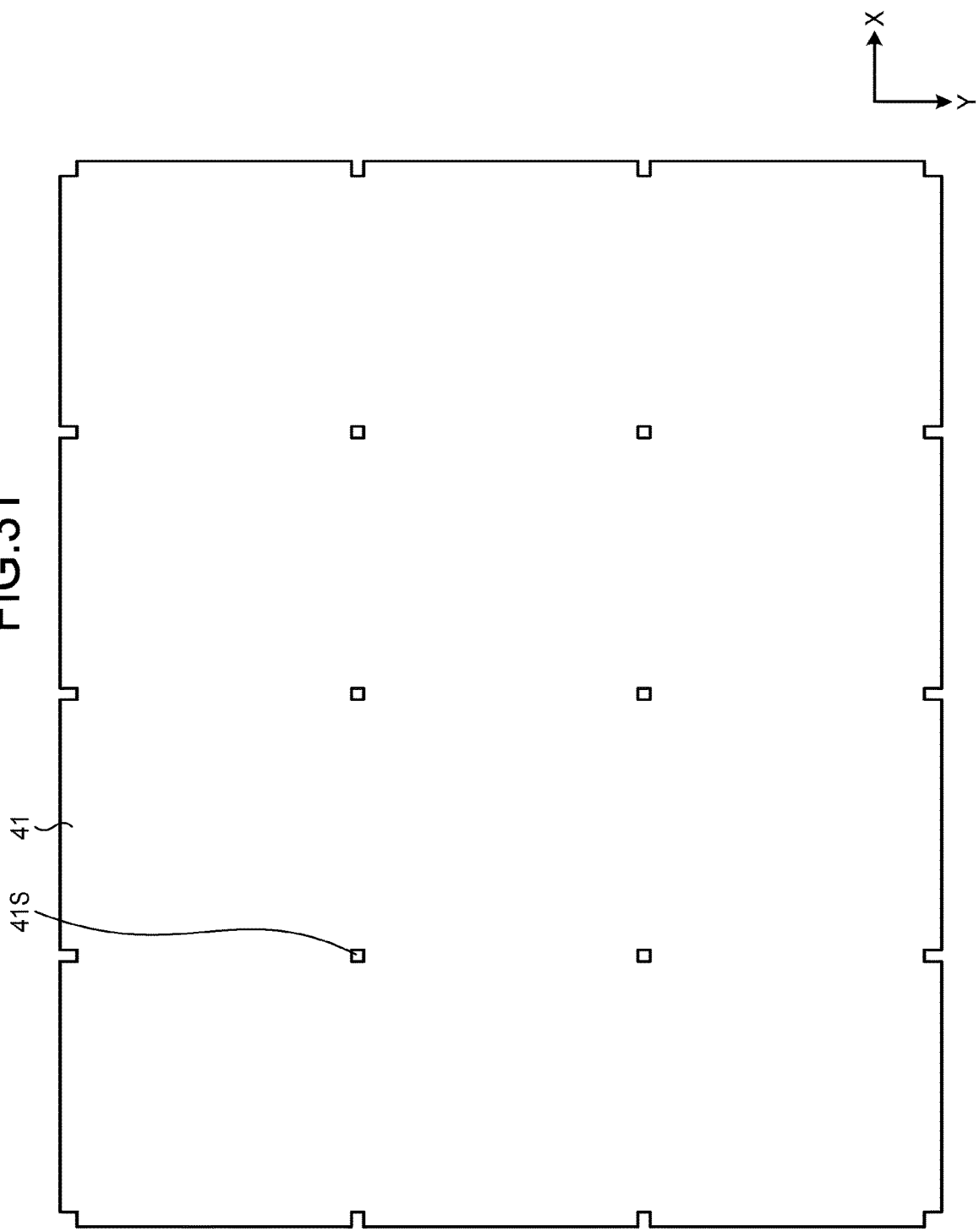
FIG. 31 is a plan view illustrating a configuration example of the common electrode according to the sixth embodiment.

FIG. 30 is a plan view illustrating a configuration example of a TFT substrate according to the sixth embodiment. FIG. 31 is a plan view illustrating a configuration example of the common electrode according to the sixth embodiment. The same components as those described in any of the above-described embodiments are assigned the same reference numerals, and overlapping descriptions thereof will be omitted.

A TFT substrate 100I according to the sixth embodiment includes the common electrodes 41. As illustrated in FIG. 31, the common electrodes 41 are formed of a solid film. The common electrodes 41 include the conductive film non-forming regions 41S that are the holes of the conductive film in the plan view.

As illustrated in FIG. 30, each of the conductive film non-forming regions 41S is disposed in a region Q surrounded by the corners of the four pixel electrodes 51 adjacent in the X-direction and the Y-direction.

Figure 32:
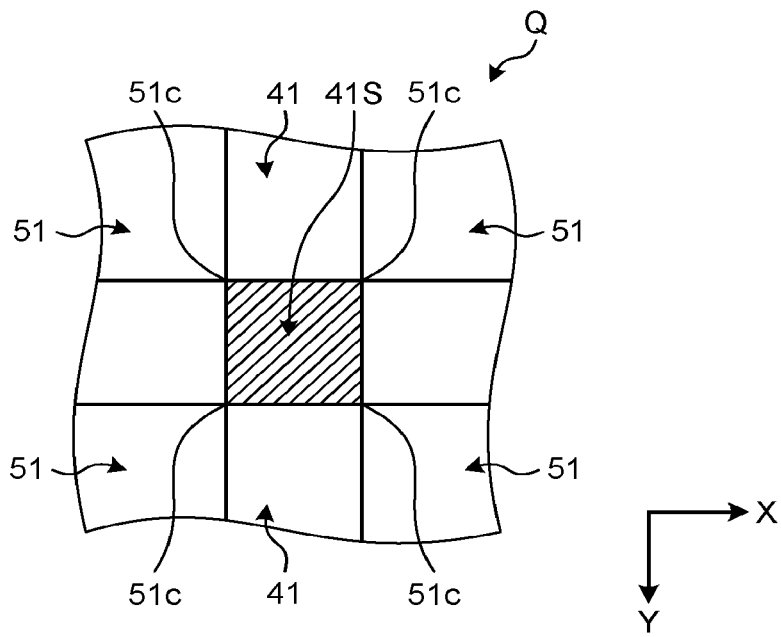
FIG. 32 is a plan view illustrating a conductive film non-forming region of the common electrode according to the sixth embodiment.

FIG. 32 is a plan view illustrating the conductive film non-forming region of the common electrode according to the sixth embodiment. FIG. 32 is an enlarged view of the region Q described above. In the sixth embodiment, the conductive film non-forming region 41S has the same area as a region surrounded by corners 51c of the four pixel electrodes 51 adjacent in the X-direction and the Y-direction.

As described above, the TFT substrate 100I according to the sixth embodiment includes the insulating base material 1, the pixel electrodes 51 that are provided on one surface side of the base material 1 and are arranged in the X-direction serving as a first direction and the Y-direction serving as a second direction intersecting the X-direction in the plan view, and the common electrodes 41 provided between the base material 1 and the pixel electrodes 51. The common electrodes 41 are formed of the conductive film, and the common electrodes 41 include the conductive film non-forming regions 41S that are the holes of the conductive film in the plan view. The conductive film non-forming region 41S overlaps with, in the plan view, at least a portion of the region Q surrounded by the corners of the four pixels adjacent in the X-direction and the Y-direction.

This configuration reduces the influence of the common electrode 41 in the conductive film non-forming region 41S. As a result, the display unevenness of the region Q is reduced to improve the display quality. The common electrodes 41 overlapping with the pixel electrodes 51 adjacent to one another in the plan view are electrically coupled together at so-called coupling portions having a large width. Accordingly, partial variations in potential decrease in the entire common electrodes 41, and the entire common electrodes 41 have an approximately constant potential. As a result, the TFT substrate 100I has smaller in-plane variations in display quality.

Any conductive metal layer or the like need not be stacked on the common electrode 41. As a result, the TFT substrate 100I can have a higher resolution.

Since portions of the pixel electrodes 51 overlapping with edges of the common electrodes 41 are reduced, steps in the pixel electrodes 51 are reduced. As a result, the yield of the TFT substrate 100I is improved.

Modifications

Figure 33:
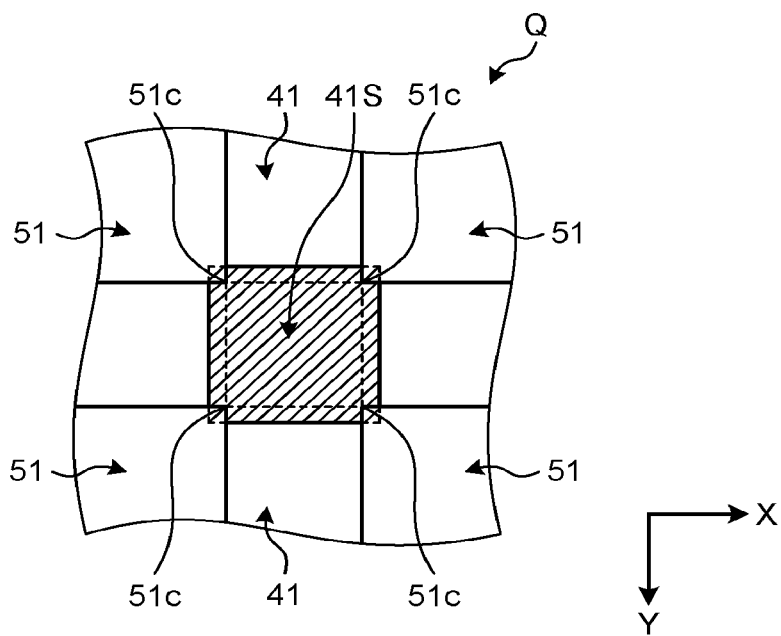
FIG. 33 is a plan view illustrating the conductive film non-forming region of the common electrode according to a first modification of the sixth embodiment.

FIG. 33 is a plan view illustrating the conductive film non-forming region of the common electrode according to a first modification of the sixth embodiment. The conductive film non-forming region 41S is larger than the region surrounded by the corners 51c of the four pixel electrodes 51 adjacent in the X-direction and the Y-direction.

This configuration can prevent the electric field from leaking out from the region Q surrounded by the corners of the four pixels adjacent in the X-direction and the Y-direction. Even if the alignment accuracy is low during exposure to light, the region Q surrounded by the corners of the four pixels adjacent in the X-direction and the Y-direction can easily overlap with the conductive film non-forming region 41S.

Figure 34:
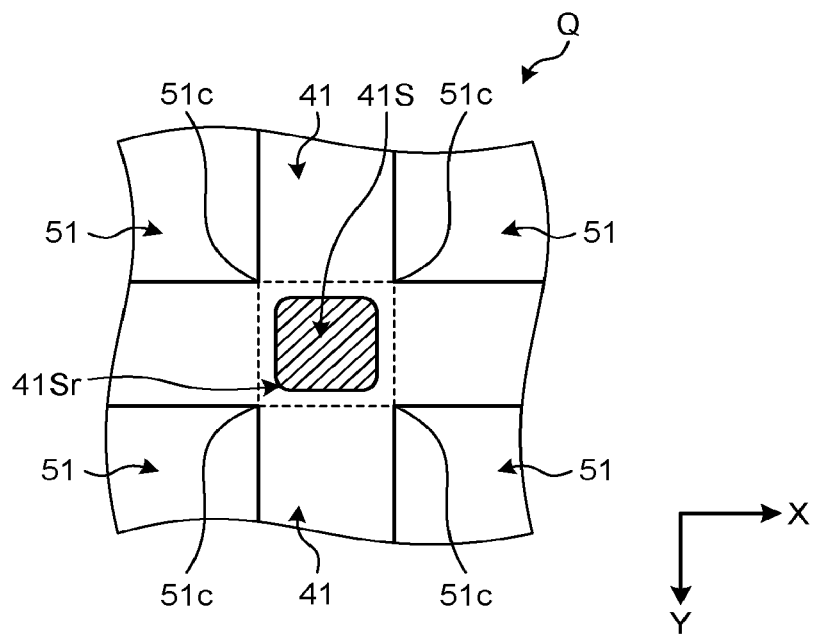
FIG. 34 is a plan view illustrating the conductive film non-forming region of the common electrode according to a second modification of the sixth embodiment.

FIG. 34 is a plan view illustrating the conductive film non-forming region of the common electrode according to a second modification of the sixth embodiment. The conductive film non-forming region 41S is smaller than the region surrounded by the corners 51c of the four pixel electrodes 51 adjacent in the X-direction and the Y-direction.

The influence of the common electrodes 41 in the conductive film non-forming region 41S decreases. As a result, the display unevenness of the region Q is reduced to improve the display quality. Since the portions of the pixel electrodes 51 overlapping with the edges of the common electrodes 41 are reduced, the steps in the pixel electrodes 51 are reduced. As a result, the yield of the TFT substrate 100I is improved.

As illustrated in FIG. 34, the conductive film non-forming region 41S is rectangular and has the rounded corners 41Sr. This configuration reduces the influence of the common electrodes 41.

Figure 35:
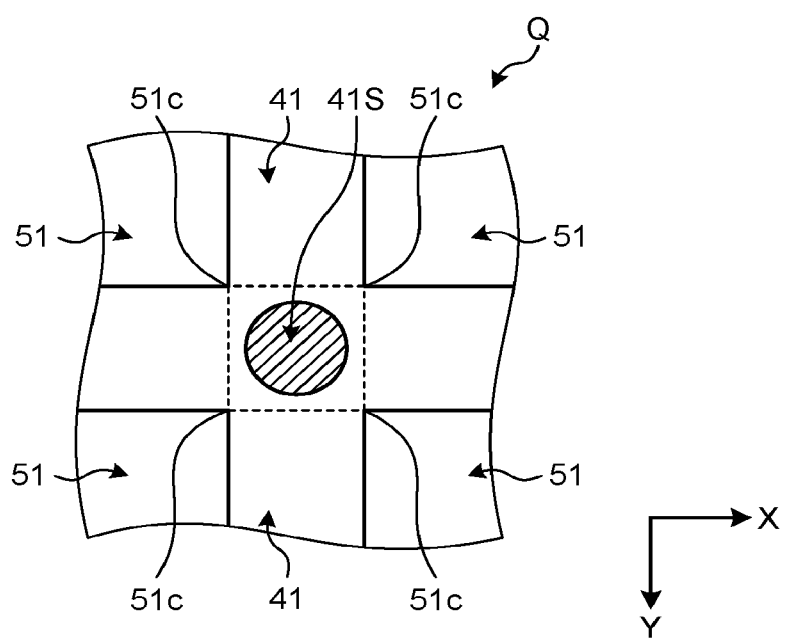
FIG. 35 is a plan view illustrating the conductive film non-forming region of the common electrode according to a third modification of the sixth embodiment.

FIG. 35 is a plan view illustrating the conductive film non-forming region of the common electrode according to a third modification of the sixth embodiment. The conductive film non-forming region 41S is circular. As a result, the shape of the conductive film non-forming region 41S is stabilized. The influence of the common electrodes 41 decreases in the conductive film non-forming region 41S. As a result, the display unevenness of the region Q is reduced to improve the display quality. Since the portions of the pixel electrodes 51 overlapping with the edges of the common electrodes 41 are reduced, the steps in the pixel electrodes 51 are reduced. As a result, the yield of the TFT substrate 100I is improved.

Figure 36:
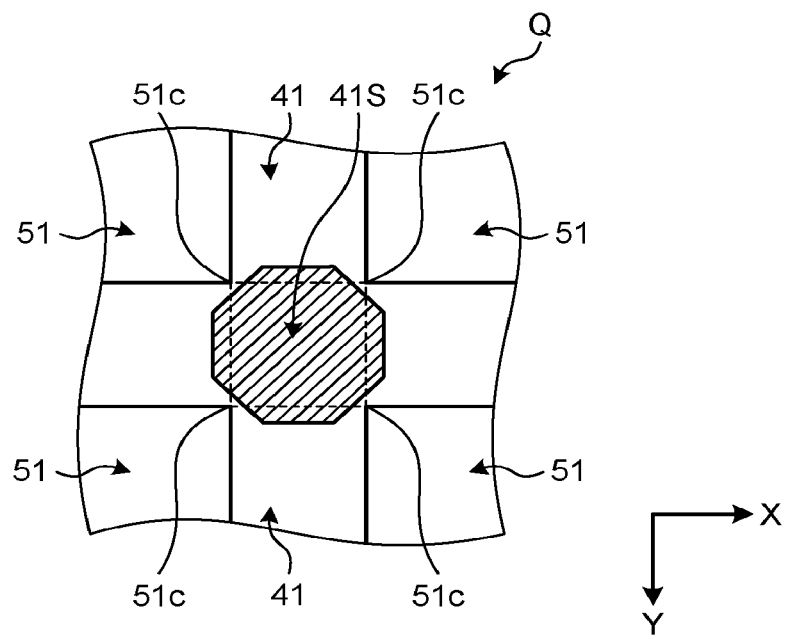
FIG. 36 is a plan view illustrating the conductive film non-forming region of the common electrode according to a fourth modification of the sixth embodiment.

FIG. 36 is a plan view illustrating the conductive film non-forming region of the common electrode according to a fourth modification of the sixth embodiment. The conductive film non-forming region 41S is octagonal. As a result, distances from the corners 51c to the conductive film non-forming region 41S can be easily made equal. The influence of the common electrodes 41 decreases in the conductive film non-forming region 41S. As a result, the display unevenness of the region Q is reduced to improve the display quality. Since the portions of the pixel electrodes 51 overlapping with the edges of the common electrodes 41 are reduced, the steps in the pixel electrodes 51 are reduced. As a result, the yield of the TFT substrate 100I is improved.

Figure 37:
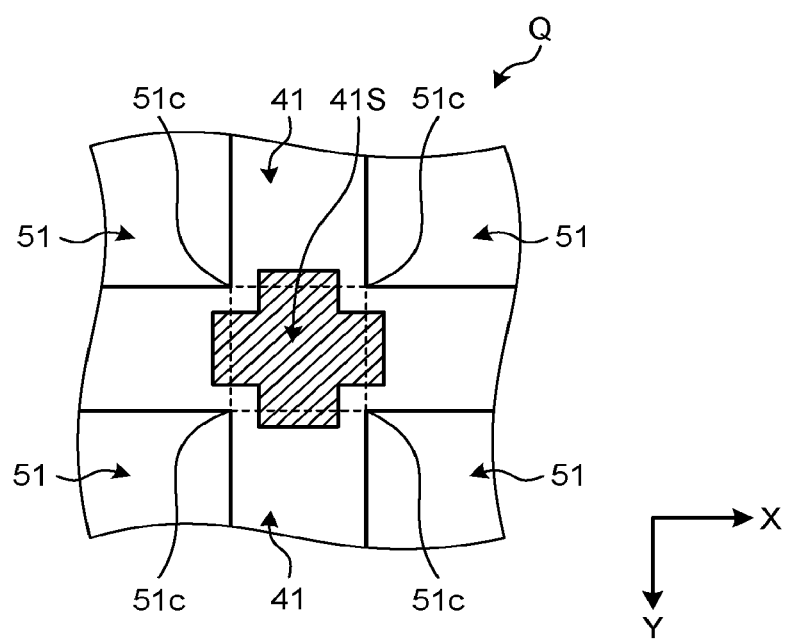
FIG. 37 is a plan view illustrating the conductive film non-forming region of the common electrode according to a fifth modification of the sixth embodiment.

FIG. 37 is a plan view illustrating the conductive film non-forming region of the common electrode according to a fifth modification of the sixth embodiment. The conductive film non-forming region 41S is cruciform. As a result, the distances from the corners 51c to the conductive film non-forming region 41S can be easily made equal. The influence of the common electrodes 41 decreases in the conductive film non-forming region 41S. As a result, the display unevenness of the region Q is reduced to improve the display quality. Since the portions of the pixel electrodes 51 overlapping with the edges of the common electrodes 41 are reduced, the steps in the pixel electrodes 51 are reduced. As a result, the yield of the TFT substrate 100I is improved.

Figure 38:
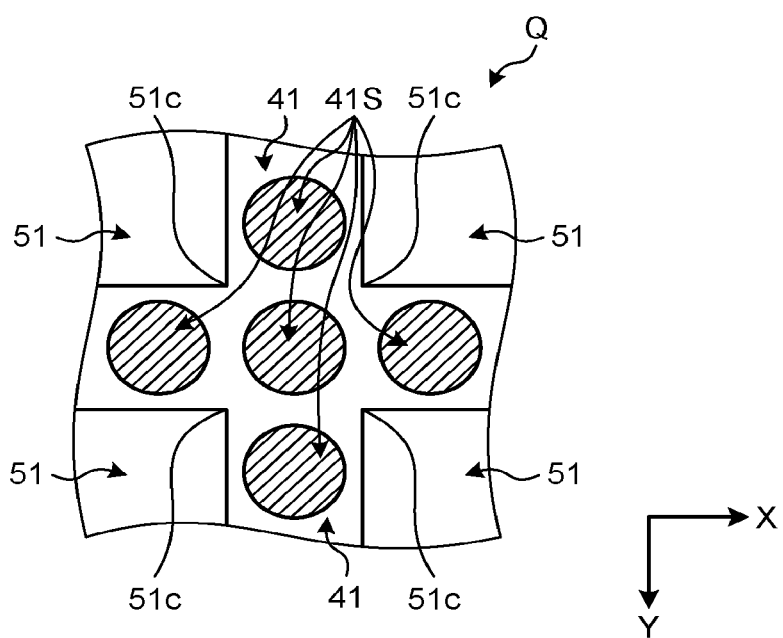
FIG. 38 is a plan view illustrating the conductive film non-forming regions of the common electrode according to a sixth modification of the sixth embodiment.

FIG. 38 is a plan view illustrating the conductive film non-forming regions of the common electrode according to a sixth modification of the sixth embodiment. The conductive film non-forming region 41S is further provided between two pixel electrodes adjacent in the X-direction and between two pixel electrodes adjacent in the Y-direction. As a result, even if the alignment accuracy is low during exposure to light, the region Q surrounded by the corners of the four pixels adjacent in the X-direction and the Y-direction can easily overlap with the conductive film non-forming region 41S. The influence of the common electrodes 41 decreases in the conductive film non-forming region 41S. As a result, the display unevenness of the region Q is reduced to improve the display quality. Since the portions of the pixel electrodes 51 overlapping with the edges of the common electrodes 41 are reduced, the steps in the pixel electrodes 51 are reduced. As a result, the yield of the TFT substrate 100I is improved.

While the preferred embodiments of the present invention have been described above, the present invention is not limited to the embodiments described above. The content disclosed in the embodiments is merely an example, and can be variously modified within the scope not departing from the gist of the present invention. Any modifications appropriately made within the scope not departing from the gist of the present invention also naturally belong to the technical scope of the present invention.

The present invention can be applied to the electrophoretic device including any one of the TFT substrate 100, and the TFT substrates 100A to 100I described above and the electrophoretic layer 160 disposed so as to face any one of the TFT substrate 100, and the TFT substrates 100A to 100I.

The present disclosure can also have the following aspects.

(1) A substrate comprising:
an insulating base material;
a plurality of pixel electrodes provided on one surface side of the base material, and arranged in a first direction and a second direction intersecting the first direction in a plan view; and
a common electrode provided between the base material and the pixel electrodes, wherein
the common electrode is formed of a conductive film, and the common electrode includes a plurality of conductive film non-forming regions that are holes of the conductive film in the plan view, and
each of the conductive film non-forming regions overlaps with, in the plan view, at least a portion of a region surrounded by corners of four of the pixel electrodes adjacent in the first direction and the second direction.

(2) The substrate according to (1), wherein the conductive film non-forming region has the same area as that of the region surrounded by the corners of the four pixel electrodes adjacent in the first direction and the second direction.

(3) The substrate according to (1), wherein the conductive film non-forming region is larger than the region surrounded by the corners of the four pixel electrodes adjacent in the first direction and the second direction.

(4) The substrate according to (1), wherein the conductive film non-forming region is smaller than the region surrounded by the corners of the four pixel electrodes adjacent in the first direction and the second direction.

(5) The substrate according to any one of (1) to (4), wherein the conductive film non-forming region is rectangular and has rounded corners.

(6) The substrate according to any one of (1) to (4), wherein the conductive film non-forming region is circular.

(7) The substrate according to any one of (1) to (4), wherein the conductive film non-forming region is octagonal.

(8) The substrate according to any one of (1) to (4), wherein the conductive film non-forming region is cruciform.

(9) The substrate according to any one of (1) to (8), wherein the conductive film non-forming region is further provided between two of the pixel electrodes adjacent in the first direction and between two of the pixel electrodes adjacent in the second direction.

(10) An electrophoretic device comprising:
the substrate according to any one of (1) to (9); and
an electrophoretic layer disposed so as to face the substrate.

What is claimed is:

1. A substrate comprising:
an insulating base material;
a pixel electrode provided on one surface side of the insulating base material;
a common electrode provided between the insulating base material and the pixel electrode;
a coupling portion provided between the insulating base material and the pixel electrode, wherein
the pixel electrode has no slit and overlaps an entire area of the common electrode, such that all sides on an outer periphery of the common electrode are located inside the pixel electrode in a plan view,
a plurality of the pixel electrodes are arranged in a first direction and a second direction intersecting the first direction in the plan view,
a plurality of the common electrodes are arranged in the first direction and the second direction,
the coupling portion couples together the common electrodes arranged in at least one of the first direction and the second direction,
the common electrodes include a first common electrode and a second common electrode that is adjacent to the first common electrode in the at least one of the first direction and the second direction,
the pixel electrodes include a first pixel electrode that overlaps an entire area of the first common electrode and a second pixel electrode that overlaps an entire area of the second common electrode,
the coupling portion couples together:
the first common electrode having all sides on an outer periphery being located inside the first pixel electrode, and
the second common electrode having all sides on an outer periphery being located inside the second pixel electrode; and
the coupling portion is coupled to neither of the first pixel electrode nor the second pixel electrode.

2. The substrate according to claim 1, further comprising a gate line extending in the first direction between the insulating base material and the pixel electrode, wherein
the coupling portion comprises wiring provided in the same layer as that of the gate line, the first common electrode is adjacent to the second common electrode in the first direction, and
the first common electrode and the second common electrode overlap the gate line.

3. The substrate according to claim 1, further comprising a signal line extending in the second direction between the insulating base material and the pixel electrode, wherein
the coupling portion comprises wiring provided in the same layer as that of the signal line,
the first common electrode is adjacent to the second common electrode in the second direction, and
the first common electrode and the second common electrode overlap the signal line.

4. The substrate according to claim 1, further comprising an organic film that is an insulating film provided between the common electrodes and the insulating base material, wherein
the coupling portion is provided on a surface of the common electrode facing the pixel electrodes, and
the coupling portion is formed of a metal material.

5. The substrate according to claim 1, further comprising an organic film that is an insulating film provided between the common electrodes and the insulating base material,
wherein the coupling portion is provided in the same layer as that of common electrode, and is made of a material having the same composition as that of the common electrode.

6. An electrophoretic device comprising:
a substrate; and
an electrophoretic layer disposed so as to face the substrate, wherein
the substrate comprises:
an insulating base material;
a plurality of pixel electrodes provided on a surface of the insulating base material facing the electrophoretic layer, and arranged in a matrix having a row-column configuration;
a plurality of common electrodes provided between the insulating base material and the pixel electrodes, and arranged in a matrix having a row-column configuration,
a coupling portion provided between the insulating base material and the pixel electrodes, and
each of the pixel electrodes faces a corresponding one of the common electrodes on a one-to-one basis, and
each of the pixel electrodes has no slit and overlaps an entire area of the corresponding one of the common electrodes, such that all sides on an outer periphery of the corresponding one of the common electrodes are located inside the each of the pixel electrodes in a plan view,
the coupling portion couples together the common electrodes arranged in at least one of a first direction and to second direction,
the common electrodes include a first common electrode and a second common electrode that is adjacent to the first common electrode in one of a first direction and a second direction,
the pixel electrodes include a first pixel electrode that overlaps an entire area of the first common electrode and a second pixel electrode that overlaps an entire area of the second common electrode,
the coupling portion couples together:
the first common electrode having all sides on an outer periphery being located inside the first pixel electrode, and
the second common electrode having all sides on an outer periphery being located inside the second pixel electrode; and
the coupling portion is coupled to neither of the first pixel electrode nor the second pixel electrode.

7. The electrophoretic device according to claim 6, wherein adjacent ones of the common electrodes are spaced from each other.

8. The electrophoretic device according to claim 7, further comprising a gate line extending in a first direction between the insulating base material and the pixel electrode, wherein
the common electrodes arranged in the first direction are coupled to one another by a coupling portion,
the coupling portion extends in the first direction in parallel to the gate line, and
the coupling portion is wiring provided in the same layer as that of the gate line.

9. The electrophoretic device according to claim 7, further comprising a signal line extending in a second direction between the insulating base material and the pixel electrode, wherein
the common electrodes arranged in the second direction are coupled to one another by a coupling portion,
the coupling portion extends in the second direction in parallel to the signal line, and
the coupling portion is wiring provided in the same layer as that of the signal line.

10. The electrophoretic device according to claim 8, further comprising an organic film between the insulating base material and the common electrodes, wherein
the first common electrode is coupled to the coupling portion through a contact hole formed in the organic film,
the contact hole facing the first pixel electrode, and
the second common electrode is coupled to the coupling portion through a contact hole formed in the organic film, the contact hole facing the second pixel electrode.

11. The electrophoretic device according to claim 9, further comprising an organic film between the base material and the common electrode, wherein
the common electrode is coupled to the coupling portion through a contact hole formed in the organic film, and
the contact hole faces the pixel electrode.

12. The electrophoretic device according to claim 10, wherein
the common electrode comprises a light-transmitting conductive film and a reflective film in contact with the light-transmitting conductive film, and
the coupling portion is in contact with the light-transmitting conductive film in the contact hole.

13. The electrophoretic device according to claim 11, wherein
the common electrode comprises a light-transmitting conductive film and a reflective film in contact with the light-transmitting conductive film, and
the coupling portion is in contact with the light-transmitting conductive film in the contact hole.

* * * * *